(12) United States Patent
Apostolos et al.

(10) Patent No.: US 8,710,360 B2
(45) Date of Patent: Apr. 29, 2014

(54) LEAKY WAVE MODE SOLAR RECEIVER

(75) Inventors: John T. Apostolos, Lyndeborough, NH (US); Judy Feng, Nashua, NH (US); William Mouyos, Windham, NH (US)

(73) Assignee: AMI Research & Development, LLC, Windham, NH (US)

( * ) Notice: Subject to any disclaimer, the term of this patent is extended or adjusted under 35 U.S.C. 154(b) by 85 days.

(21) Appl. No.: 13/357,448

(22) Filed: Jan. 24, 2012

(65) Prior Publication Data

US 2012/0205525 A1 Aug. 16, 2012

Related U.S. Application Data

(60) Provisional application No. 61/441,720, filed on Feb. 11, 2011, provisional application No. 61/540,730, filed on Sep. 29, 2011, provisional application No. 61/502,260, filed on Jun. 28, 2011.

(51) Int. Cl.
  *H01L 31/00* (2006.01)
  *H01L 31/0232* (2006.01)
  *H01L 31/052* (2014.01)

(52) U.S. Cl.
  CPC ............. *H01L 31/0522* (2013.01); *Y02E 10/52* (2013.01); *H01L 31/0232* (2013.01)
  USPC ........................................................ 136/259

(58) Field of Classification Search
  CPC ................... H01L 31/02322; H01L 31/02325; H01L 31/02366; H01L 31/0257; H01L 31/0528; H01L 31/055; H01L 31/0522
  USPC ........................ 136/259; 359/559, 615, 337.5
  See application file for complete search history.

(56) References Cited

U.S. PATENT DOCUMENTS

| | | | |
|---|---|---|---|
| 3,864,111 A | 2/1975 | Kemp | |
| 3,883,221 A | 5/1975 | Rigrod | |
| 3,898,585 A | 8/1975 | Heidrich et al. | |
| 4,116,718 A * | 9/1978 | Yerkes et al. | ................ 136/246 |
| 4,357,486 A | 11/1982 | Blieden | |
| 4,445,050 A | 4/1984 | Marks | |
| 4,574,161 A | 3/1986 | Marks | |
| 4,932,743 A | 6/1990 | Isobe et al. | |
| 5,090,017 A | 2/1992 | Mendenhall et al. | |
| 5,177,352 A | 1/1993 | Carson | |

(Continued)

FOREIGN PATENT DOCUMENTS

| | | |
|---|---|---|
| EP | 2 348 342 | 7/2011 |
| JP | 2007218540 A * | 8/2007 |

(Continued)

OTHER PUBLICATIONS

J. H. Karp and J. E. Ford, "Planar micro-optic solar concentration using multiple imaging lenses into a common slab waveguide", Proceedings of SPIE 7407, High and Low Concentrator Systems for Solar Electric Applications IV, 74070D (Aug. 20, 2009).*

(Continued)

*Primary Examiner* — Jeffrey T Barton
*Assistant Examiner* — Eric R Smith
(74) *Attorney, Agent, or Firm* — Cesari and McKenna, LLP

(57) ABSTRACT

A leaky travelling wave array of optical elements provide a solar wavelength rectenna.

19 Claims, 35 Drawing Sheets

(56) References Cited

U.S. PATENT DOCUMENTS

| | | |
|---|---|---|
| 5,235,589 A | 8/1993 | Yokomori |
| 5,315,676 A | 5/1994 | Sunagawa |
| 5,390,046 A | 2/1995 | Gesell et al. |
| 5,420,947 A | 5/1995 | Li |
| 5,637,358 A | 6/1997 | Otoshi |
| 5,652,816 A | 7/1997 | Minami |
| 5,726,662 A | 3/1998 | Hopwood |
| 5,781,676 A | 7/1998 | Okada |
| 6,016,122 A | 1/2000 | Malone et al. |
| 6,281,766 B1 | 8/2001 | Malone et al. |
| 6,434,303 B1 | 8/2002 | Temkin |
| 6,501,093 B1 | 12/2002 | Marks |
| 6,730,389 B2 | 5/2004 | Voeltzel |
| 6,847,155 B2 | 1/2005 | Schwartz et al. |
| 6,898,352 B2 | 5/2005 | Deliwala |
| 6,993,236 B1 | 1/2006 | Gunn, III |
| 7,071,888 B2 | 7/2006 | Sievenpiper |
| 7,095,928 B2 | 8/2006 | Blauvelt et al. |
| 7,157,989 B2 | 1/2007 | Kim |
| 7,190,326 B2 | 3/2007 | Voeltzel |
| 7,408,507 B1 | 8/2008 | Paek et al. |
| 7,456,803 B1 | 11/2008 | Sievenpiper |
| 7,949,210 B2 | 5/2011 | Durfee |
| 7,972,522 B2 | 7/2011 | Jordana et al. |
| 8,160,404 B2 | 4/2012 | Pan |
| 2002/0171078 A1 | 11/2002 | Eliasson et al. |
| 2003/0118306 A1 | 6/2003 | Deliwala |
| 2004/0022050 A1 | 2/2004 | Yamashita et al. |
| 2004/0045932 A1 | 3/2004 | Kochergin et al. |
| 2005/0008294 A1 | 1/2005 | Park et al. |
| 2007/0240757 A1 | 10/2007 | Ren et al. |
| 2008/0186508 A1 | 8/2008 | Kiesel et al. |
| 2008/0187011 A1 | 8/2008 | Kiesel et al. |
| 2009/0066597 A1 | 3/2009 | Yang et al. |
| 2009/0245725 A1 | 10/2009 | Yonekura |
| 2010/0001917 A1 | 1/2010 | Manasson et al. |
| 2010/0108133 A1 | 5/2010 | Bhagavatula |
| 2010/0139749 A1 | 6/2010 | Mapel |
| 2010/0139769 A1 | 6/2010 | Mapel |
| 2010/0200044 A1 | 8/2010 | Zaban et al. |
| 2010/0212717 A1 | 8/2010 | Whitlock et al. |
| 2010/0288352 A1* | 11/2010 | Ji et al. .................. 136/256 |
| 2011/0023941 A1 | 2/2011 | Didomenico |
| 2011/0030757 A1 | 2/2011 | Lin et al. |
| 2011/0220172 A1 | 9/2011 | Layton |
| 2011/0232211 A1 | 9/2011 | Farahi |
| 2011/0253198 A1 | 10/2011 | Patrick |
| 2011/0255824 A1 | 10/2011 | Lee et al. |
| 2012/0204937 A1 | 8/2012 | Apostolos |
| 2012/0204954 A1 | 8/2012 | Apostolos |
| 2012/0204955 A1 | 8/2012 | Apostolos |
| 2012/0204956 A1 | 8/2012 | Apostolos |
| 2012/0205525 A1 | 8/2012 | Apostolos |
| 2012/0206807 A1 | 8/2012 | Apostolos |

FOREIGN PATENT DOCUMENTS

| | | |
|---|---|---|
| JP | 2009/053458 A | 3/2009 |
| WO | WO 2007/138589 | 12/2007 |
| WO | WO 2009/002943 | 3/2009 |
| WO | WO 2009/064888 | 5/2009 |
| WO | WO 2010023657 A2 * | 3/2010 |
| WO | WO 2010033859 A2 * | 3/2010 |
| WO | WO 2011/119179 | 9/2011 |

OTHER PUBLICATIONS

R. D. Guenther, Modern Optics, John Wiley & Sons, p. 30 (1990).*
Machine translation of JP2007-218540A.*
Vaccaro, S., et al. "Making Planar Antennas Out of Solar Cells" Electronic Letters, 38:17, Aug. 15, 2002.
Lin, C., et al. "Nano-Structured and Micro-Structured Semiconductors for Higher Efficiency Solar Cells"; IEEE Singapore, 4 pages, Dec. 8-11, 2008.
Tentzeris, M. "IMS2011 Abstract Card"; TU1C: RFID Technologies and Applications, Jun. 7, 2011.
Sarehraz, M., et al. "Rectenna Developments for Solar Energy Collection"IEEE, pp. 78-81; Aug. 8, 2005.
Grover, S., "Traveling-Wave Metal/Insulator/Metal Diodes for Improved Infrared Bandwidth and Efficiency of Antenna-Coupled Rectifiers" IEEE Transactions of Nanotechnology; 9:6, Nov. 2010.
Bozzetti, M., et al "Analysis and Design of a Solar Rectenna" IEEE, pp. 2001-2004; Nov. 10, 2010.
Baba, T. "Monolithic Integration of an ARROW-Type Demultiplexer and Photodetector in the Shorter Wavelength Region" Journal of Lightwave Technology 8:1; Jan. 1990.
Tangonan, G.L., et al. "Tapered gap prism couplers for high index materials" Applied Optics; 16:7 pp. 1795-1796; Jul. 1977.
Transmittal of International Preliminary Report on Patentability for International Application No. PCT/US12/24872, International Filing Date Feb. 13, 2012 by AMI Research & Development, LLC for High Performance, Low-Profile Antennas, 39 pages.
Mashall & Gordon, "Rectenna harvesting of sunlight", Feb. 24, 2012.
Office Action U.S. Appl. No. 13/357,451, Oct. 11, 2012.
Guenther "Modern Optics", John Wiley & Sons 1990.
Milonni et al. "Laser Physics" John Wiley & Sons 2010, pp. 331-400.
International Search Report and the Written Opinion, date of mailing Aug. 6, 2012 for International Application No. PCT/US2012/022717 for AMI Research & Development, LLC International Filing Date Jan. 26, 2012, 17 pages.
International Search Report and the Written Opinion, date of mailing Jun. 22, 2012 for International Application No. PCT/US2012/024872 for AMI Research & Development, LLC International Filing Date Feb. 13, 2012, 11 pages.
Stevenson, Richard, "Photovoltaics take a load off soldiers," Technology Solar Cells, Copyright Institute of Physics and IOP Publishing Ltd, 2006, 3 pages.

* cited by examiner

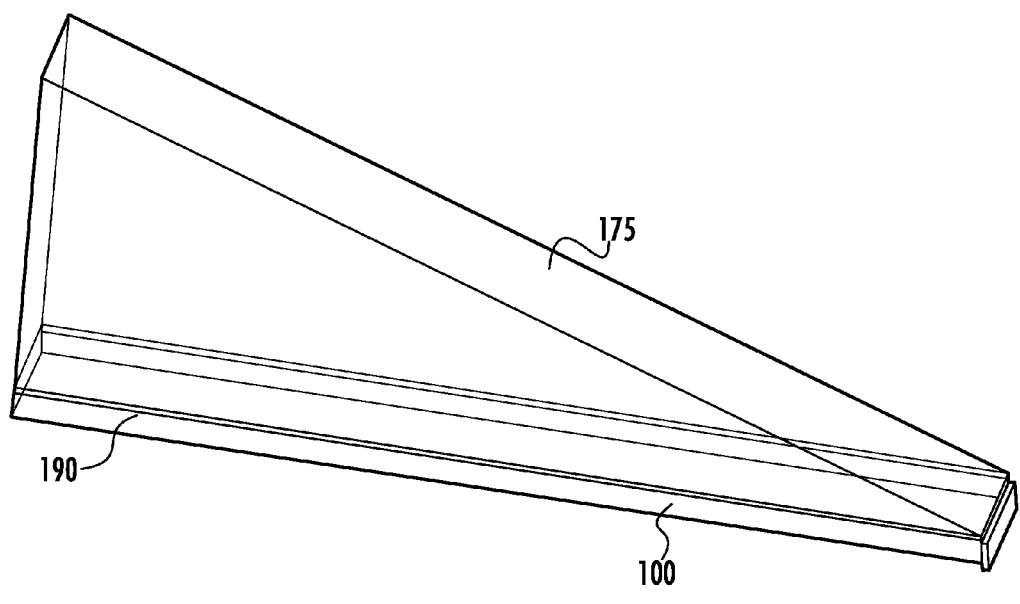
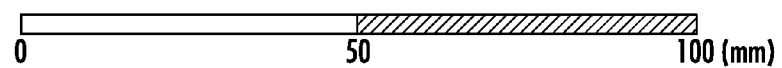
FIG. 1-4

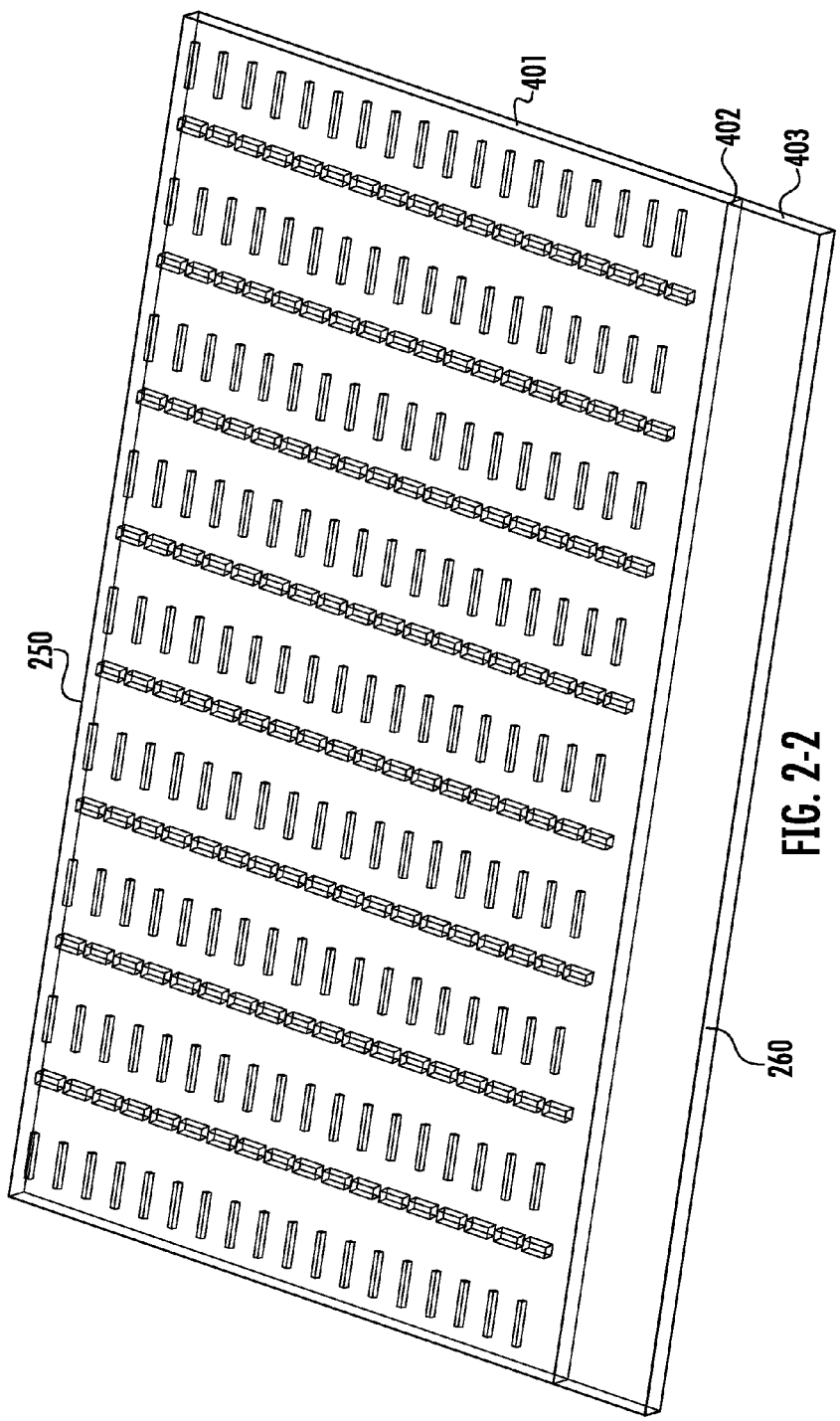

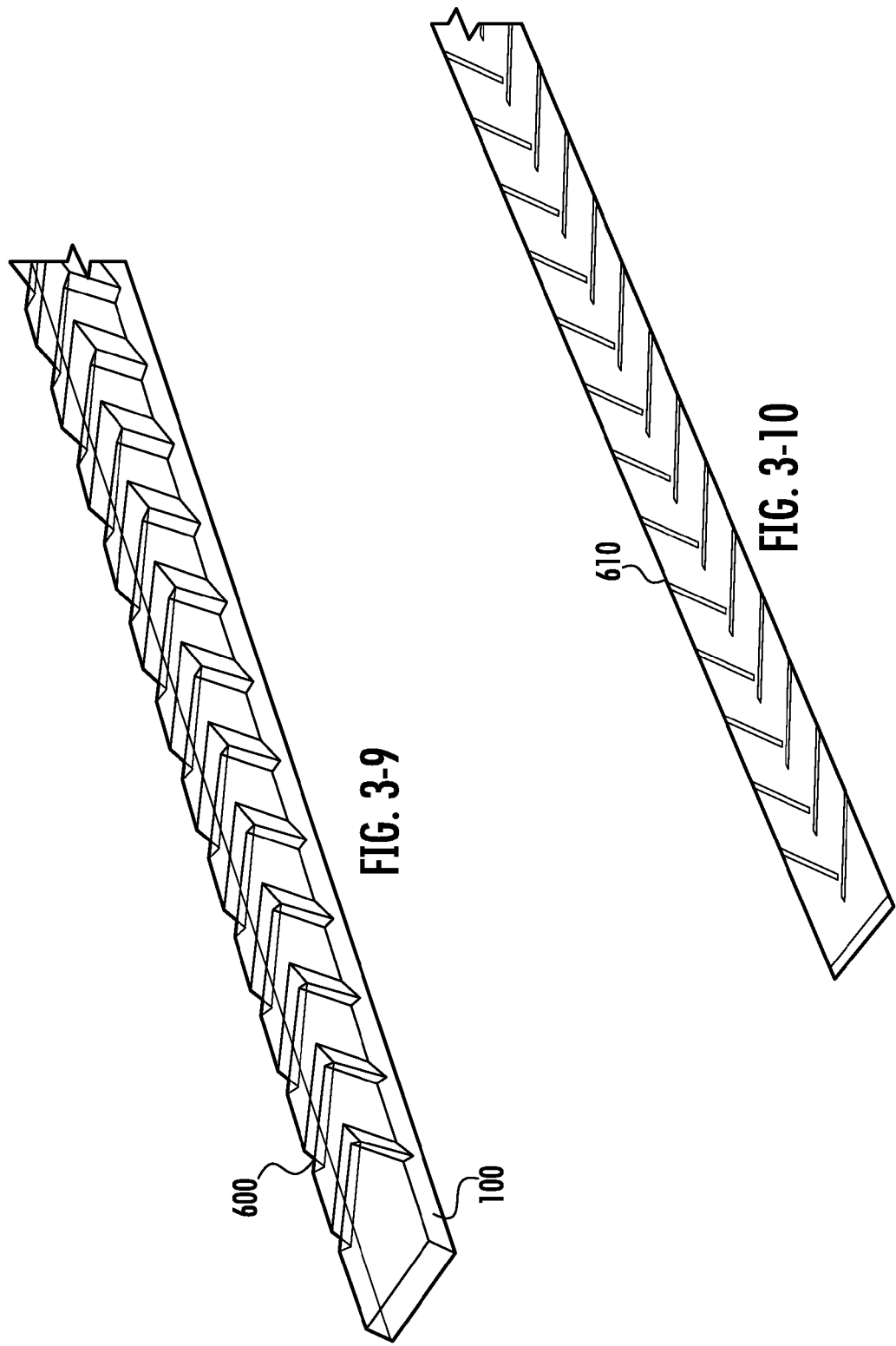

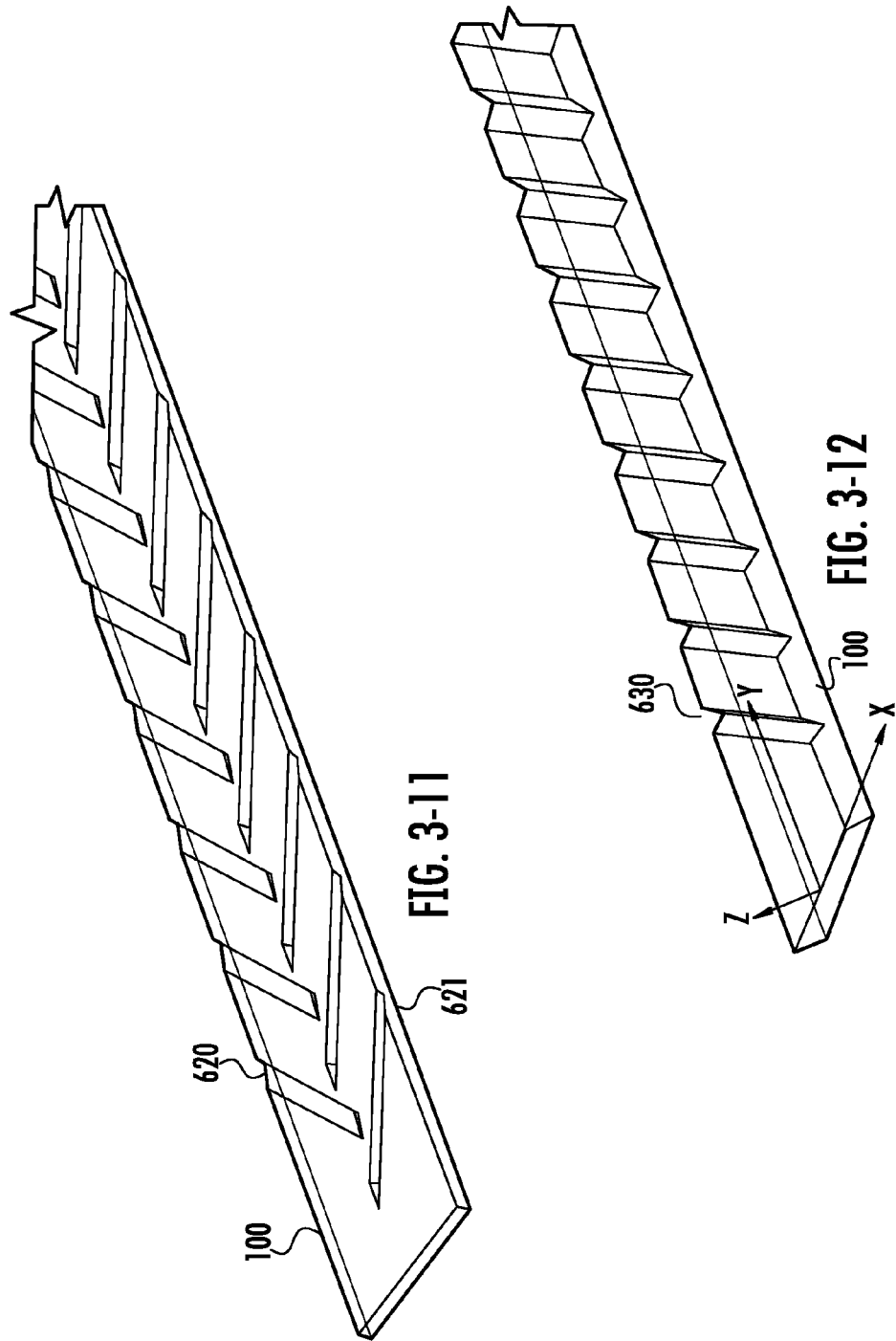

LEAKY WAVE MODE SOLAR RECEIVER

RELATED APPLICATION(S)

This application claims the benefit of U.S. Provisional Application No. 61/441,720, filed on Feb. 11, 2011 and U.S. Provisional Application No. 61/540,730, filed on Sep. 29, 2011. The entire teachings of the above application(s) are incorporated herein by reference.

This application also claims the benefit of U.S. Provisional Application No. 61/502,260, filed on Jun. 28, 2011.

BACKGROUND

Energy consumption has increased by 50% over the last 25 years with 80% of the world's power still generated by fossil fuels. Clean, renewable alternative energy sources are needed to meet increasing energy consumption. Photovoltaic solar technology is viewed as one possible solution, but to meet the increasing demands, dramatic improvements are needed in solar conversion efficiency and cost/complexity reduction. Currently available mass produced low cost solar panels are at best about 10% efficient, with an upper theoretical limit of about 30% efficiency.

An alternative approach to photovoltaic technology is the fabrication of an array of optical antennas with rectifier elements located at the outputs of the optical antennas. These antennas elements are known as "rectennas". There is no fundamental efficiency limit to rectenna arrays and conversion efficiencies of >85% have been achieved at microwave frequencies as a method of wireless power transmission. The main reason that solar rectenna technology has not achieved wide acceptance is the difficulty of fabricating efficient rectifier elements at optical frequencies that work at the low fields present at each rectenna element.

SUMMARY

In one implementation, a solar energy apparatus includes a waveguide having a top surface, a bottom surface, a collection end and a detection end. One or more scattering features are disposed on the top surface of the waveguide or within the waveguide. The scattering features achieve operation in a leaky propagation mode.

One or more solar energy detectors are disposed adjacent to the detection end. The detector may be one or more photovoltaics or a MIM-diode.

The scattering features may take various forms. They may, for example, be a metal structure such as a rod formed on or in the waveguide. In other embodiments the scattering features may be one or more rectangular slots formed on or in the waveguide. In other embodiments the scattering features may be grooves formed in the top surface of the waveguide. The slot and/or grooves may have various shapes.

The waveguide may be a dielectric material such as silicon nitride, silicon dioxide, magnesium fluoride, titanium dioxide or other materials suitable for leaky wave mode propagation at solar wavelengths.

The scattering feature dimensions and spacing may vary with their respective position along the waveguide. For example, adjusting the spacing of the scattering features may assist with the leaky mode coupling to waves propagating within the waveguide, allowing the waveguide to leak a portion of power along the its entire length, and improving efficiency or bandwidth.

In other embodiments, selected scattering features may be positioned orthogonally with respect to one another. This permits the apparatus to capture multiple light polarizations. In this arrangement, the scattering features can be located at each element position in an array of scattering features or may be arranged as a set of one-dimensional line arrays with the features of alternating line arrays providing different polarizations.

In still other arrangements, a wavelength correction element adds linear delay to incident solar energy received by the waveguide. This permits a resulting beam direction of the apparatus to be independent of the receive energy wavelength. This correction element may be formed from a set of discrete features embedded in the waveguide with a periodically modulated spacing; or it may be embodied as a material layer that tapers from a thin section at the collection end to a thick section near the detection end. The wedge is preferably formed of a material having a higher dielectric constant then the waveguide. With this arrangement a second wedge of material may also be provided to compensate for dispersion introduced by the first wedge.

The leaky propagation mode of operation may be further enhanced by a coupling layer placed between the waveguide and a continuous wedge lens. With this arrangement the coupling layer has a dielectric constant that changes from the detection end to the collection end, therefore providing increased coupling between the waveguide and the wedge lens as a function of the distance along the main axis of the waveguide. This function may also be provided by a coupling layer decreasing in thickness with distance from the detection end. Such a coupling layer may equalize the horizontal and vertical mode propagation velocities in the waveguide. In still other arrangements, the waveguide may itself be formed of two or more layers. Adjacent layers may be formed of materials with different dielectric constants. Gaps may be formed between the layers with a control element provided to adjust a size of the gaps. The gap spacing control element may be, for example, a piezoelectric, electroactive material or a mechanical position control. Such gaps may further control the beamwidth and direction.

In still other arrangements, a multilayer waveguide may provide frequency selective surfaces to assist with maintaining a constant beam shape over a range of wavelengths. The spacing in such an arrangement between the layers may follow a chirp relationship.

In yet another arrangement, a layer disposed adjacent the waveguide may provide quadratic phase weighting along a primary waveguide axis. This may further assist in maintaining a constant width solar beam. The quadratic phase weight may be imposed by a layer having a thickness that tapers from a detection end to a collection end, or may be provided in other ways such as by subsurface elements formed within the waveguide that vary in length, spacing and/or depth from the surface.

In a preferred configuration, the energy collectors may be formed of multiple, spatially separated photovoltaics of different wavelengths. This permits greater range of wavelength operation and therefore, greater efficiency. Anti-reflective coatings may be applied between the surface of the waveguide and the collectors to further provide for greater efficiency.

A waveguide having scattering features as described herein can focus a receive solar energy beam along an azimuthal direction. This allows the apparatus to be physically scanned in an elevational direction that changes position with time of day, enabling tracking of the sun as it moves along the horizon.

BRIEF DESCRIPTION OF THE DRAWINGS

The foregoing will be apparent from the following more particular description of example embodiments of the invention, as illustrated in the accompanying drawings in which like reference characters refer to the same parts throughout the different views.

The drawings are not necessarily to scale, emphasis instead being placed upon illustrating embodiments of the present invention.

FIG. 1-2 is an implementation using orthogonal scattering elements.

FIG. 1-3 is a specific embodiment as a single dielectric rod with V- and H-polarized scattering features.

FIG. 1-4 is another implementation where the leaky propagation mode is provided by a continuous structure.

FIG. 1-5 illustrates the H- and V-beam patterns for the implementation of FIG. 1-4.

FIG. 2-1 is a slab embodiment with a group of line arrays having co-located cross-polarized scattering features.

FIG. 2-2 is a slab embodiment with a group of line arrays having alternating cross-polarized scattering features.

FIG. 3-1 is a detailed view of a dielectric waveguide with surface rectangular grooves that provide good single polarization efficiency.

FIG. 3-2 is another embodiment with a dielectric waveguide with surface triangular grooves provide good single polarization efficiency.

FIG. 3-3 illustrates metal strips in a cross configuration, offset from the centerline to provide co-located features to achieve V and H polarization.

FIG. 3-4 illustrates dielectric grooves in a cross configuration also providing collocated V and H polarization response.

FIG. 3-5 shows an implementation that increases the H-pol efficiency (and hence improving the axial ratio) by asymmetrically grooving the H portion of the element deeper into the waveguide, which also increases the coupling for the H pol portion.

FIG. 3-6 separates the V and H pol grooves along the waveguide surface, which further increases radiation efficiency from each scattering element because it minimizes cross coupling between adjacent pairs.

FIG. 3-7 shows vertically separate V and H pol elements, which can provide increased efficiency over collocated "crosses"; while the V and H elements are not technically collocated here, separating these vertically allows the V and H pol elements to use the same sun-facing surface area.

FIG. 3-8 illustrates offset spherical lens elements providing both V and H-pol response.

FIG. 3-9 shows how triangular grooves can be combined and collocated for two adjacent multi-polarized line arrays in a single sub-array.

FIG. 3-10 is an implementation where the scattering features obtain circular polarization with interleaved metal strips.

FIG. 3-11 implements metal strips imprinted as dielectric triangular or rectangular grooves to provide V and H pol response.

FIG. 3-12 rotates the orientation of the triangular or rectangular grooves to provide a mixed V and H pol response.

FIG. 3-13 has scattering features implemented as raised triangle structures to provide a single polarization response.

FIG. 3-14 is a similar implementation using raised right angle trapezoid structures to also provide a single polarization response.

FIG. 3-15 shows raised interleaved crosses to provide V and H pol response.

FIG. 3-16 is an implementation with offset longitudinal slots providing H pol response along the long axis.

FIG. 4-1 illustrates a correction wedge used on the incoming side of a rod-type linear waveguide to provide linear delay to the scattering features.

FIG. 4-2 illustrates the wedge with low dielectric constant gap to improve performance.

FIG. 4-3 is an alternate embodiment where a surface structure can also provide linear delay.

FIG. 5 is a double wedge to control the dispersion.

FIG. 6 shows the double wedge used with the slab array embodiment.

FIG. 7 illustrates dispersion for various lengths of a dielectric rod.

FIG. 8 shows a waveguide formed of multiple layers having a chirped spacing to provide frequency selective surfaces (FSS).

FIG. 9 is a more detailed view of the waveguide having surface scattering features and chirped Bragg FSS layers.

FIG. 10-1 is a tapered dielectric layer to provide quadratic phase weighting.

FIG. 10-2 is another way to achieve quadratic phase weighting.

FIG. 11 is a way to provide effective dielectric constant control by changing gap size.

FIG. 12 is a wideband/scanning configuration.

FIG. 13 shows reconfigurable chirped Bragg structures.

FIG. 14 shows a single elongated gap used with multiple arrays.

FIG. 15 is a rod array geometry where the collector region has two or more spatially separated photovoltaic (PV) cells and anti-reflective coatings.

FIG. 16 illustrates a corner reflector in more detail permitting positioning of the PV cells on both sides of the collector region.

DETAILED DESCRIPTION OF PREFERRED EMBODIMENTS

Figure 1:
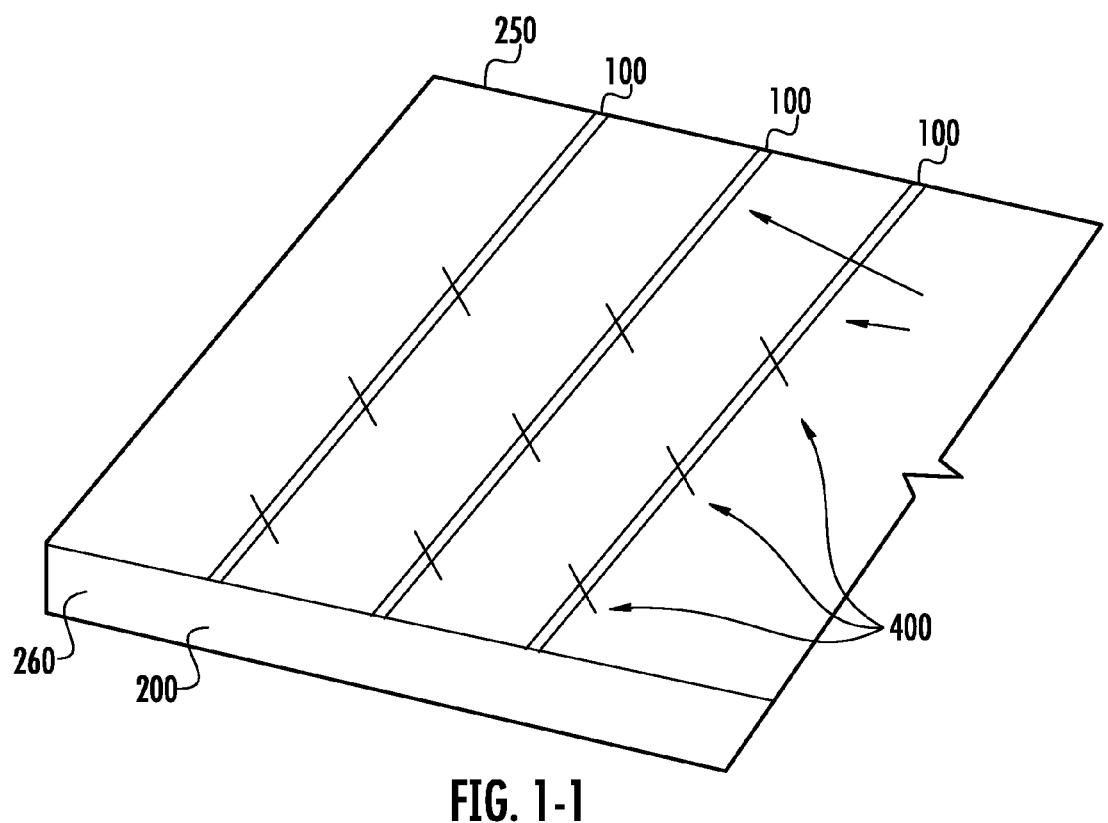
FIG. 1-1 is a conceptual diagram of one implementation of a solar array using discrete scattering elements to operate in a leaky propagation mode.

A description of example embodiments follows.

Traveling Leaky Wave Array

Recent attempts at creating a rectenna array have resulted in efficiencies ranging from 1% to 2%. Each antenna in the array has its own rectification element, leading to very low fields generated across the rectifier.

In preferred embodiments herein, much improved efficiency is provided by a waveguide structure having scattering features arranged in one or more subarrays. The subarrays operate in a leaky propagation mode at wavelengths ranging from about 0.4 to 2.0 microns. Placement of detection element(s) across the subarray outputs increases the received solar energy field by orders of magnitude over that of a single element.

In particular embodiments, the subarray makes use of beam forming techniques relying on 1) quadratic time delay feeds to maintain the beamwidth at a constant width(e.g., 0.5 degrees, the solar angular width,) and 2) changing the direction of the beam by adjusting the propagation constant of the array. The multiple parallel 1-D subarrays provide fan beams which can track the sun as it progresses from east to west.

Single line source leaky wave antennas can be used to synthesize frequency scanning beams. The array elements are excited by a traveling wave progressing along the array line. Assuming constant phase progression and constant excitation amplitude, the direction of the beam is that of Equation (1).

$$\cos \theta = \beta(\text{line})/\beta - (\lambda m)/s \quad (1)$$

where s is the spacing between elements, m is the order of the beam, $\beta$ (line) is the leaky mode propagation constant, and $\beta$ is the free space propagation constant., and $\lambda$ is the wavelength. Note the frequency dependence of the direction of the beam.

To minimize losses, an array of dielectric surface wave guides feeds employs an array of one-dimensional, dielectric rectangular cross section subarray waveguides (also called "rods" herein). Alternately, one large panel or "slab" of dielectric can house multiple line subarrays.

Treating each of the subarrays as a transmitting case, the dielectric structure is excited at one end and the energy travels along the waveguide. The waveguide leaks and scatters a small amount of the energy along its length until at the end whatever power is left is absorbed by the resistive loads. In the far-field, the scattered energy from each element will be in phase, creating a high gain beam at some angle.

More particularly, treating each of the sub arrays as a solar energy receiver, the dielectric structure receives solar energy at a collector end, and the energy travels along the waveguide. The waveguide absorbs and scatters a small amount of the energy along its length until all the in-phase components reinforce at the detection end, where a solar collector (e.g., a photovoltaic or MIM diode, etc.) absorbs the solar energy converting it to electrical energy.

In one embodiment, dielectric surface waveguide feeds employ an array of dielectric rectangular cross sectional rods as the primary elements.

One preferred geometry is generally shown in FIG. 1-1. A set of dielectric rods 100 are disposed in parallel on a substrate 200 and extend from a collector end 250 to a detection end 260. Each dielectric rod provides a single one-dimensional sub array. Scattering elements 400 disposed along each of the rods are provided by conductive strips formed on, grooves cut in the surface of, or grooves entirely embedded into, the dielectric. Each rod may be as long as 100 solar wavelengths, and there may be many such scattering elements, as many as 10,000 elements, along each rod.

The HE11 mode, which has no cut off frequency, is the propagating mode of choice for the waveguide.

Figures 1, 2:
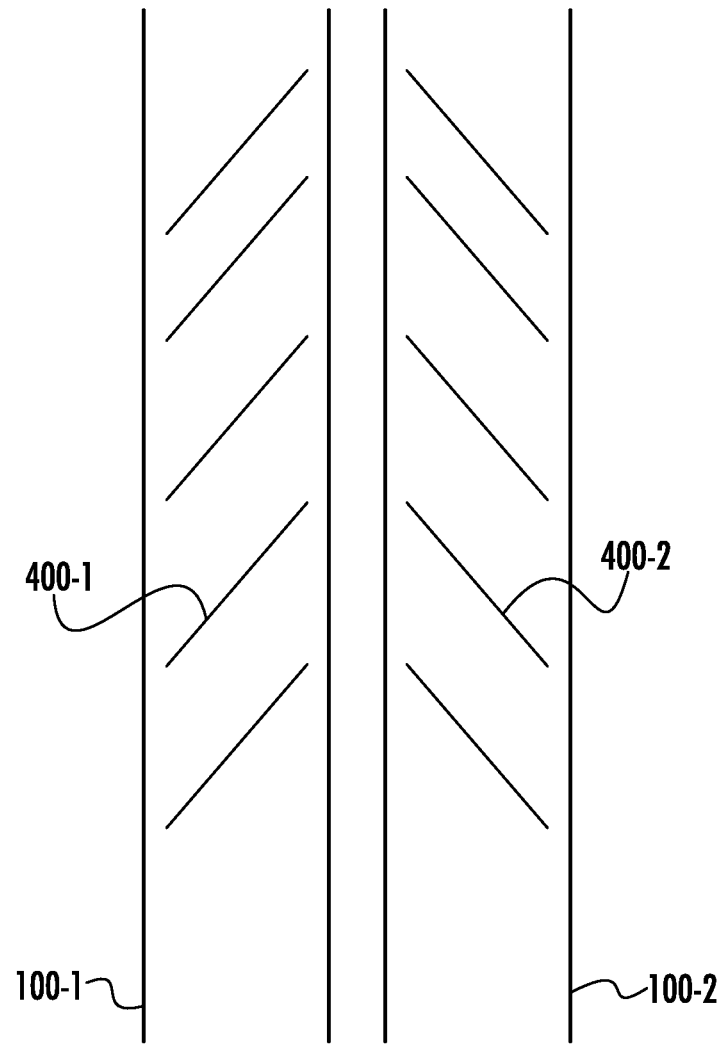

As generally shown in FIG. 1-2, adjacent rods 100-01, 100-2 may have scattering features 400-1, 400-2 with alternate orientation(s) to provide orthogonal polarization (such as at 90 degrees to provide both horizontal (H) and vertical (V) polarization). This tends to maximize energy capture since solar energy is unpolarized (randomized polarization).

Construction

As mentioned briefly above, these sub arrays can be constructed individually, such as in a linear one-dimensional rod configuration (see FIG. 1-3 for an example) or with multiple line arrays located on or within a single dielectric panel or "slab" (see FIGS. 2-1 and 2-2 for examples).

Individual scattering element design is dependent on the choice of construction and will be described in more detail below. It suffices here to say that the scattering elements and can be provided in a number of ways, such as conducting strips or non-conducting grooves embedded into the dielectric waveguide.

Collocated elliptically polarized elements provide polarization diversity to maximize the energy captured since solar energy is randomly polarized. In one embodiment, that shown in FIG. 1-3, surface grooves 105 are co-located and orthogonally disposed with respect to embedded areas cut-out 107 of the dielectric at each position in the array. In this implementation, the width of the grove 105 in the upper surface of the waveguide 100 may change with position along the waveguide. If $\lambda$ is the wavelength of operation of the sub array, the groove width may increment gradually, such as from $\lambda/100$ at the detection end 250 to $\lambda/2$ at the collection end 260; the spacing between features may be constant, for example, $\lambda/4$.

FIG. 1-4 illustrates another way to implement leaky mode operation. Individual scattering elements originally embedded in or on the waveguide can be replaced with a continuous leaky wave wedge structure 175. The coupling between the waveguide and the wedge preferably increases as a function of distance along the waveguide to facilitate constant amplitude along the radiation wavefront. This may be accomplished by inserting a third layer 190 between the wedge and the waveguide with a decreasing thickness along the waveguide. This coupling layer 190, preferably formed of a material with yet another relative permittivity constant, ensures that the power leaked remains uniform along the length of the corresponding rod or slab.

The propagation constant in this "leaky wedge with waveguide" implementation of FIG. 1-4 determines the beam direction. To receive both horizontal and vertical polarization at a given beam direction, the propagation constants for horizontal and vertical modes of the waveguide-wedge configuration must be equal. There is a slight difference in the propagation constants for the H- and V-pol modes, which is manifested as a slight difference in the beam direction (3 degrees) as shown in FIG. 1-5. The vertical beam is shifted more than the horizontal implying a slightly higher propagation constant. By applying a thin layer of high dielectric material on the bottom of the waveguide, the horizontal propagation constant can be increased relative to the vertical resulting in the beams coinciding.

Slab Configuration

As mentioned briefly above, groups of sub arrays can be disposed on a substrate formed as a two-dimensional panel or slab 300. In these slab configurations, the sub arrays are orthogonally polarized to achieve horizontal (H) and vertical (V) polarization, either with collocated cross-polarized scattering features (such as in the FIG. 2-1 configuration), or alternating sub-arrays of cross-polarized scattering features (FIG. 2-2). It is recognized that if collocated orthogonally polarized features are as efficient as a single polarization embodiment, the overall efficiency of the device will be greater by utilizing more sun-facing surface area with both polarizations.

The waveguide in these slab configurations operates in a TM and TE mode in the vertical and horizontal.

The FIG. 2-1 and FIG. 2-2 slab configurations may be formed on a silicon substrate (not shown) with the dielectric waveguide embodied as a set of waveguide core sections, including (a) a main core section 401 starting adjacent the collection end and extending to (b) a tapered section 402 and (c) a lossy core section 403 extending from the tapered section to the detection end 260. Suitable dielectric materials include $Si_3N_4$, $SiO_2$, $MgF_2$, and $TiO_2$.

A cladding layer (not shown) may be disposed between the main waveguide section and/or tapered core section(s).

The lossy waveguide section disposed adjacent the detection end houses multiple detectors of different wavelengths as described in more detail below.

This slab implementation can provide ease of manufacture and better performance by eliminating edge effects.

Scattering Feature (Element) Designs

There are a multitude of element makeups that provide varying degrees of efficiency. Due to metal Ohmic heating losses and manufacturability at these sizes, it is desirable to use a dielectric groove or imprint structure. However, it is also possible to use metalized elements to capture the same effect, albeit with higher losses. The following figures show element shapes that have varying degrees of ellipticity, and/or high efficiency in a single polarization. With all element cases, there remain two similarities. The element spacing distribution has an effect on the frequency of operation and bandwidth of the array. For each element type and bandwidth desired, the spacing of element to element is optimized. For most element types, there is a width distribution increasing along the long axis of the sub-array, as mentioned above. The intention of this increasing width distribution is to couple and scatter a similar amount of energy from each element. To do this, the elements near the detector region (or feed) are narrower, so they do not scatter as much energy per unit area as the elements further down the long axis. The width distribution is adapted for example, from Rodenbeck, Christopher T., "A novel millimeter-wave beam-steering technique using a dielectric-image-line-fed grating film", Texas A & M University, 2001 at equation 3. This width relationship is optimized for each element type to maximize array radiation efficiency.

Figures 1, 2, 3:
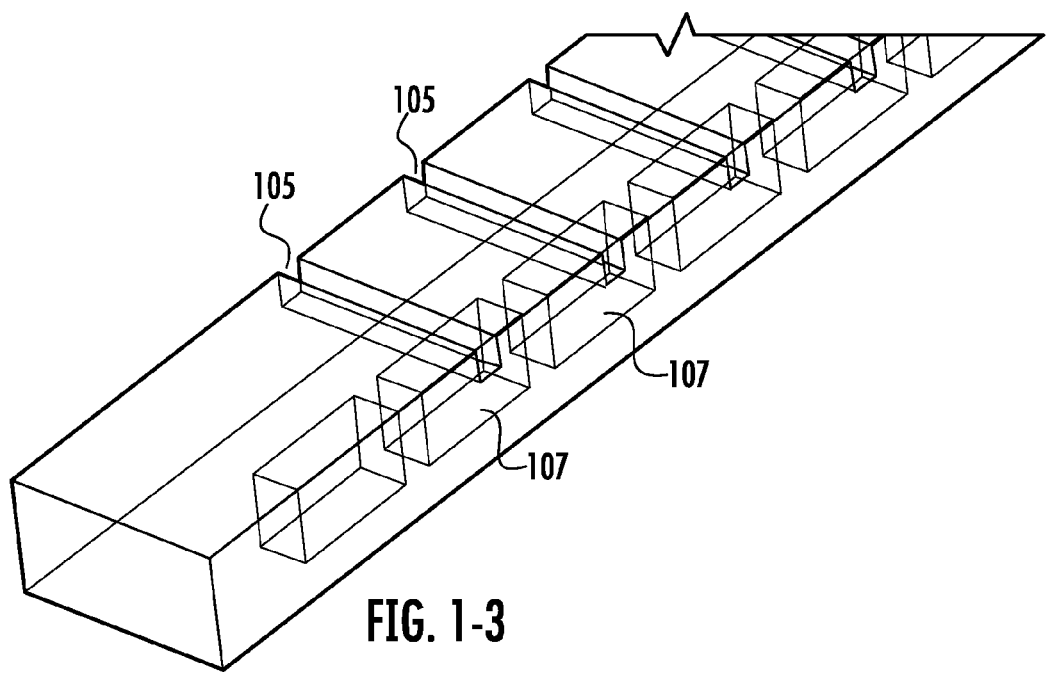

FIGS. 3-1 though 3-16 depict various scattering element shapes for both the one-dimensional rod and array (slab) configurations.

FIG. 3-1 is a single rectangular dielectric rod waveguide 160 with surface rectangular grooves 150 that provide single polarization.

FIG. 3-2 is another embodiment with a dielectric rod waveguide 100 with surface features shaped as triangular grooves 151.

FIG. 3-3 illustrates metal strips 501 disposed on the surface of the dielectric rod 100. The strips are shaped in a cross configuration, and are preferably offset from a centerline of the rod. This arrangement provide co-located features to achieve V polarization (V-pol) and H polarization (H-pol).

Figures 1, 2, 3, 4, 5:
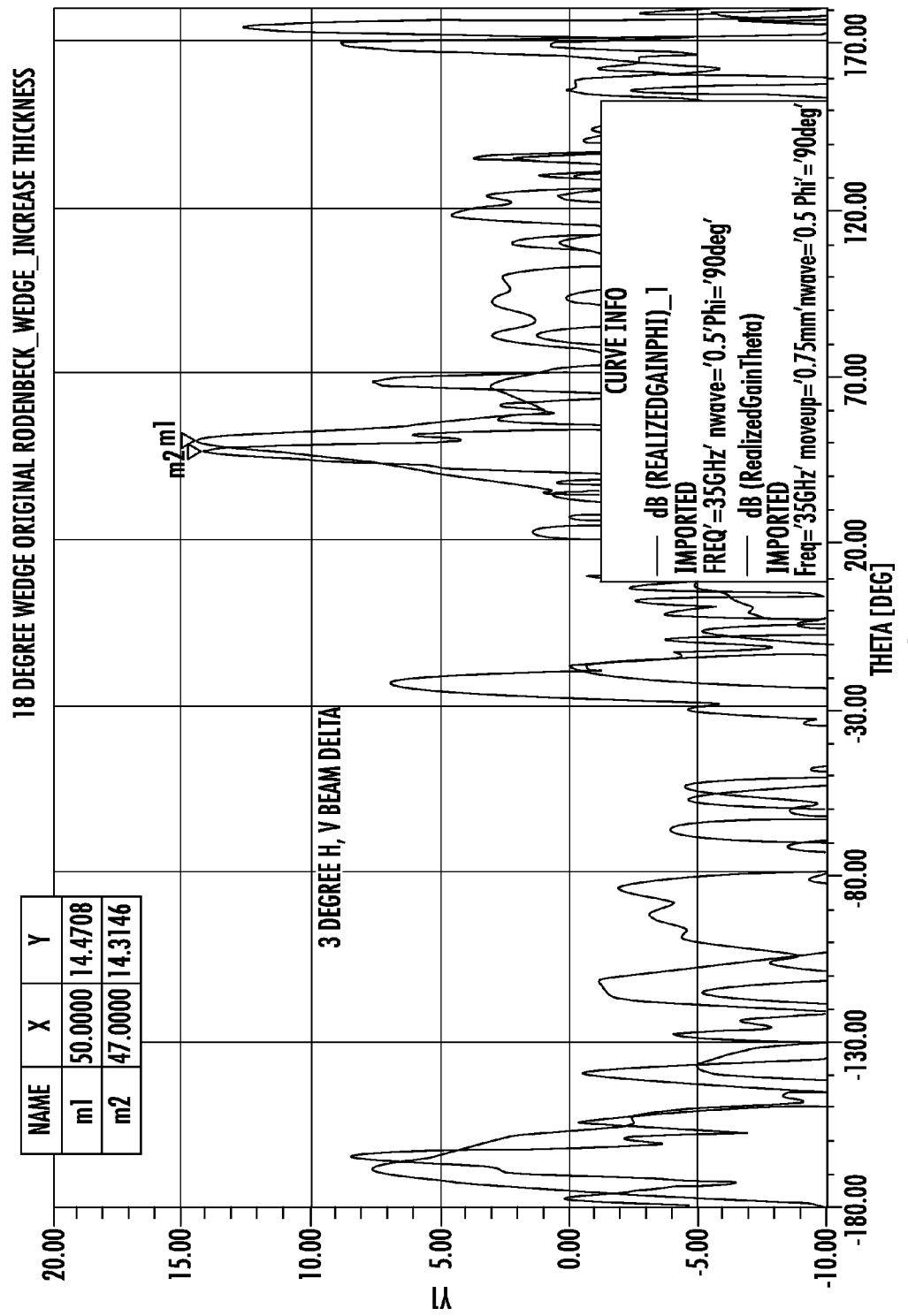
Figures 1, 2:
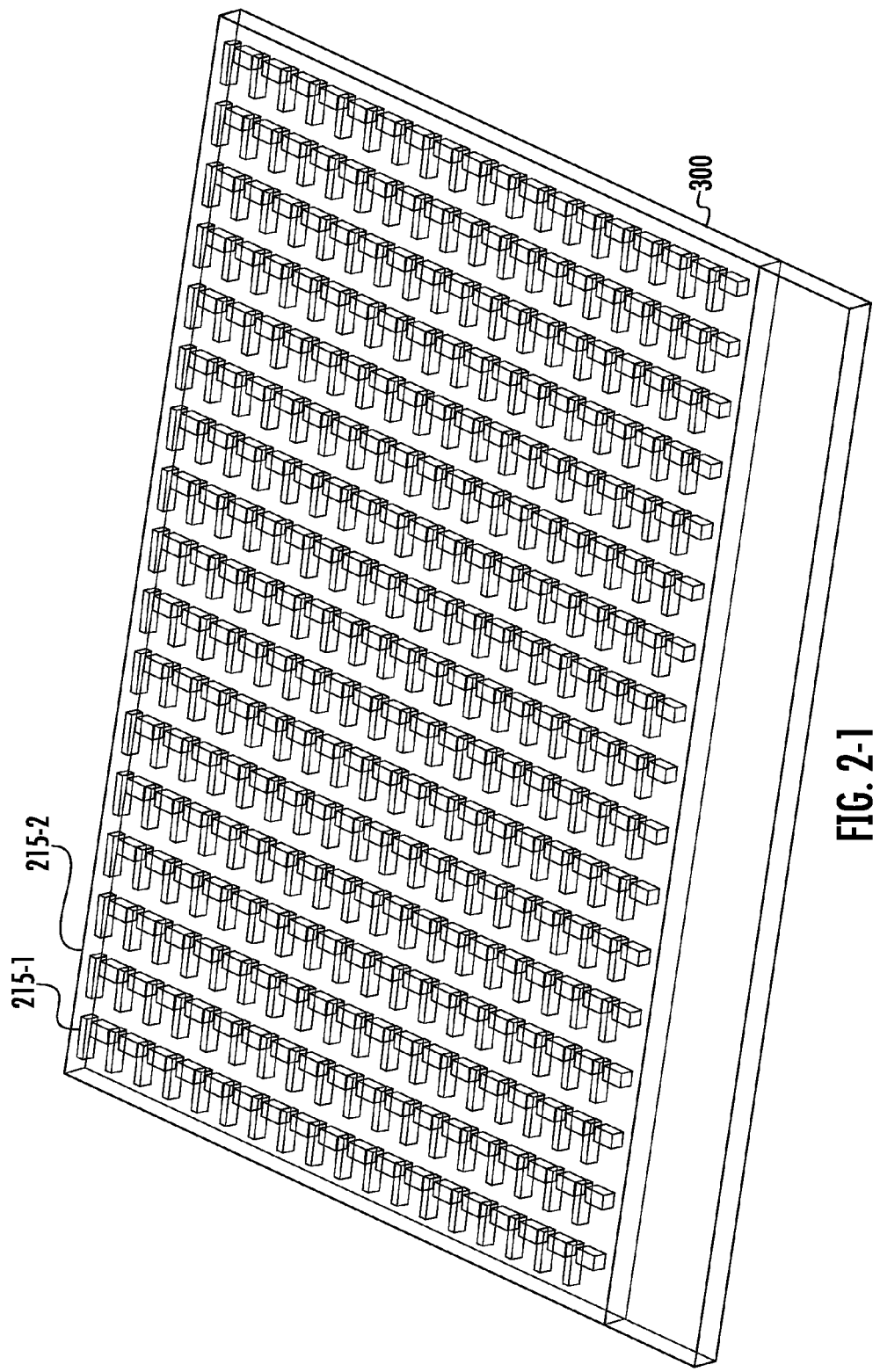

FIG. 3-4 illustrates dielectric grooves 502 in a cross configuration also providing collocated V and H polarization response.

FIG. 3-5 shows an implementation that increases the H-pol efficiency (and hence improving the axial ratio) by asymmetrically grooving the H portion 570 of the element deeper into the waveguide, which also increases the coupling for the H-pol portion.

FIG. 3-6 separates the V-pol and H-pol 580, 581 grooves along the waveguide 100 surface, which further increases radiation efficiency from each scattering element because it minimizes cross coupling between adjacent pairs.

FIG. 3-7 shows vertically separate V- and H-pol elements 590, 591, which can provide increased efficiency over collocated "crosses". While the V- and H-pol elements are not technically collocated here, separating these vertically allows the V- and H-pol elements to use the same sun-facing surface area.

FIG. 3-8 illustrates arrays of offset spherical lens elements 594-1, 594-2 providing both V and H-pol response.

FIG. 3-9 is an implementation using triangular grooves that can be combined and collocated for two adjacent multi-polarized line arrays in a single sub-array. Note that the width of the grooves 600 changes with position along the sub-array.

FIG. 3-10 is an implementation where the scattering features obtain circular polarization with interleaved metal strips 610.

FIG. 3-11 implements metal strips imprinted as dielectric triangular or rectangular grooves 620, 621 to provide V and H-pol response.

FIG. 3-12 rotates the orientation of the triangular or rectangular grooves 630 to provide a mixed V and H pol response.

FIG. 3-13 has scattering features implemented as raised triangle structures 640 to provide a single polarization response.

FIG. 3-14 is a similar implementation using raised right angle trapezoid structures 641 to also provide a single polarization response.

FIG. 3-15 shows raised interleaved crosses 650 to provide V- and H-pol response.

FIG. 3-16 is an implementation with offset longitudinal slots 670, 671 providing H-pol response along the long axis.

Wideband Operation

A significant challenge is the instantaneous bandwidth of the array. Equation (1) indicates that there is a shift in the beam direction as the frequency changes. This distortion is caused by the fact that all usable beams are higher order beams. Since we want the cover the band between 0.4 to 2.0 microns, we have developed two methods of correcting this frequency distortion. (Please note that other bands are possible).

Correction Wedge

FIG. 4-1 shows a dielectric rod type one-dimensional (1-D) sub-array 305 configuration with surface scattering features similar to that of FIG. 3-1 decreasing in size with position from the collection end to the detection end.

The first approach to correcting frequency distortion introduced by this geometry is to situate a correcting layer 700 on top of the sub-array 305. This layer, shown in FIG. 4-1, permits the use of the principal m=0 order.

The idea behind the correction layer, is to linearly add increasing delay to the scattering elements from the collector end to the detection end. Incident radiation enters along the top surface of the wedge and is delayed depending upon the location of incidence. When this is done properly, the quiescent delay for each element across the top plane of the correction layer is therefore the same, regardless of the position along the sub-array at which the solar energy was received. The effect is that in the far-field, the beams over frequency line up at the same point, which resulting beam would then be aimed at the sun.

Figures 1, 3:
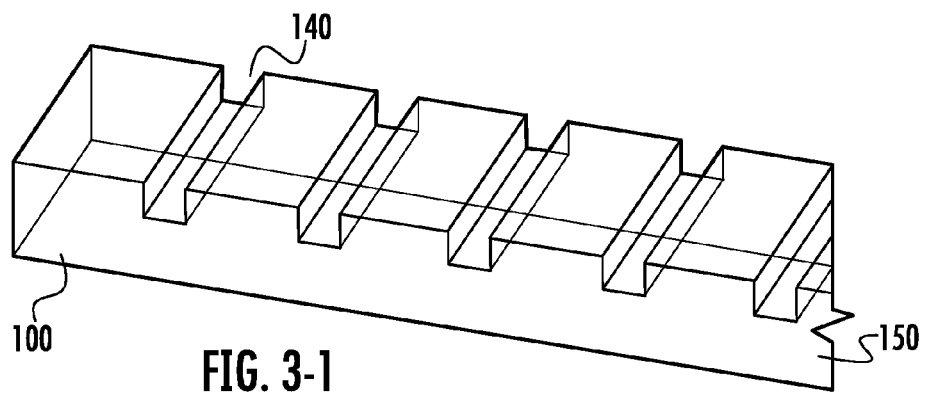
Figures 2, 3:
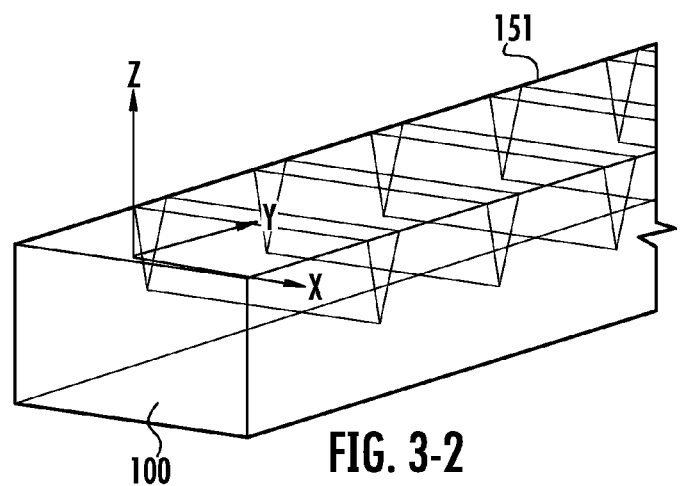
Figure 3:
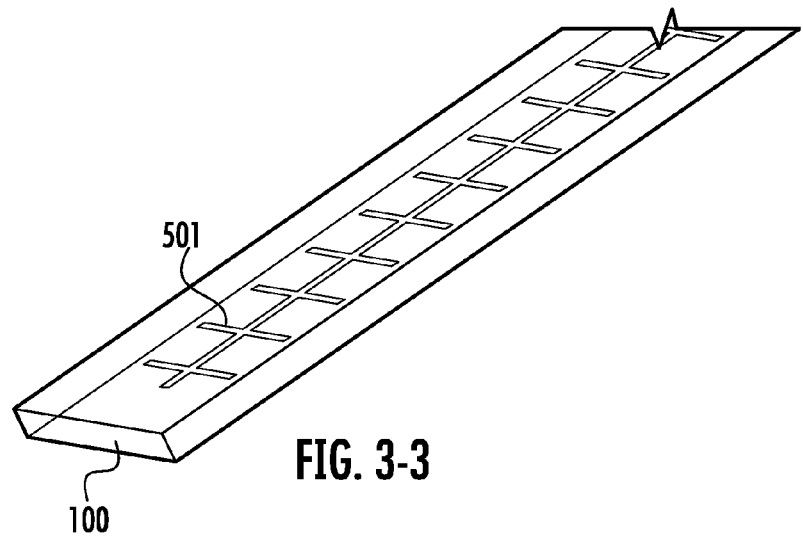
Figures 3, 4:
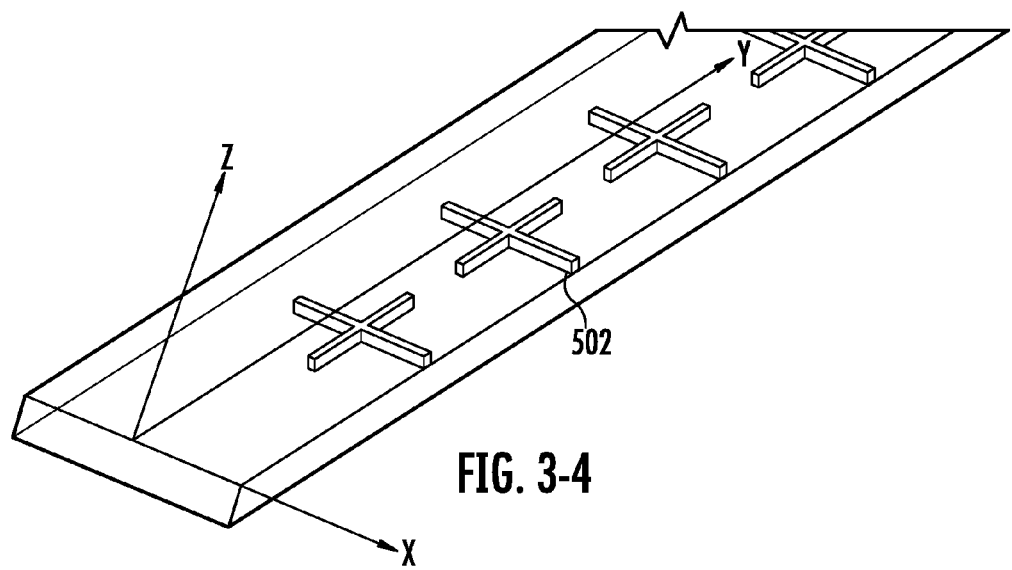
Figures 3, 4, 5:
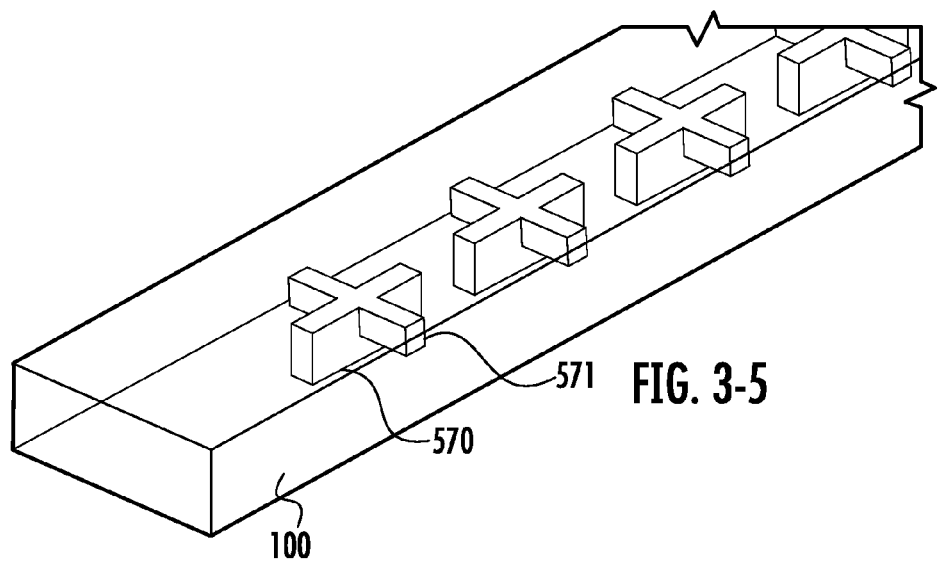
Figures 3, 4, 5, 6:
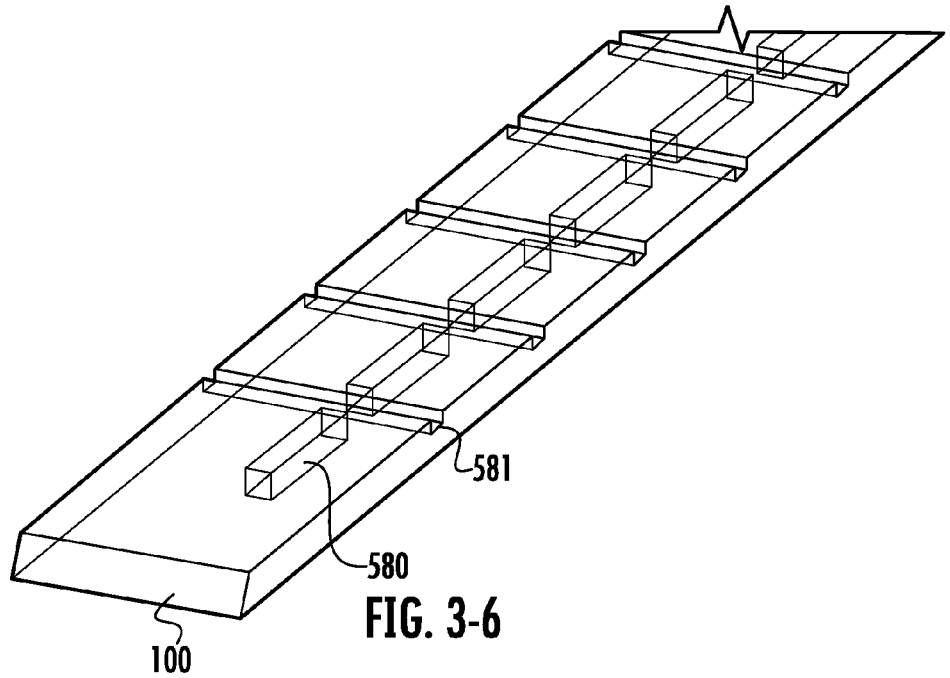
Figures 3, 4, 5, 6, 7:
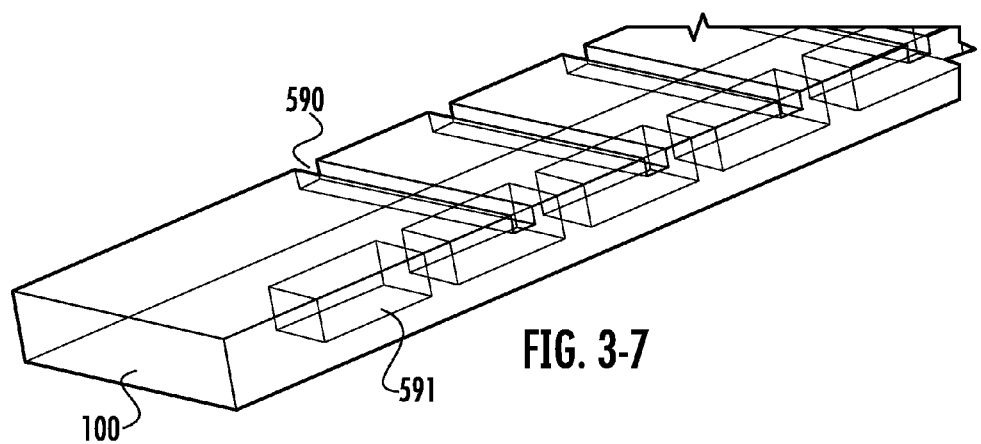

One implementation that has been modeled indicates a $TiO_2$ top wedge layer 700, and a lower dielectric $SiO_2$ waveguide 100. Forming the correction wedge of a higher dielectric permits it to be "shorter" in height". There are a multitude of materials that can be used to implement the correction wedge 700. The propagation constant of the waveguide should also be constant as a function of frequency, which is achieved by operating in the constant propagation regions of the waveguide as shown in FIG. 7 (the waveguide dispersion curves).

Linear delay can be implemented in other ways. For a multiple rod implementation, depositing a set of wedges, like wedge 700 for each 1-D array would be tedious. Instead, one can fabricate a molded plastic sheet with a series of wedges. In other implementations, a $TiO_2$ layer with top facing grooves can replace the wedge to re-radiate the energy incident on the scattering elements as per FIG. 4-3. A coupling layer with a tapered shape but constant dielectric may be disposed between the $TiO_2$ and $SiO_2$ layers.

Since the wedge of FIG. 4-1 may introduce unwanted dispersion along the array, it may be necessary to compensate. There are two options.

1) It is possible to insert a low dielectric constant gap 782 (FIG. 4-2) between the wedge and the dielectric waveguide 100. This gap 782 allows the waveguide to guide the wave while not affecting the propagation constant. The wedge 700 sitting above this gap still retain its delay characteristics for each element of the 1-D array.

2) A second wedge 790 can be situated beneath the waveguide 100, holding constant the dispersion along the waveguide (FIG. 5). The same technique can be used on the slab line arrays (FIG. 6).

Chirped Bragg Layers

Chirped Bragg layers situated underneath the waveguide structure can alter the propagation constant of the waveguide as a function of frequency. In this way, it is possible to line up beams in the far-field, making this antenna broadband.

The dispersion of the dielectric rod is shown in FIG. 7 for various diameters (D) of the rod. $F_c$ is the center frequency of the desired band ($F_u$-$F_1$). As the diameter changes from 0.1 wavelengths to 0.4 wavelengths, C/V, the ratio of free space velocity to velocity in the rod, increases along the rod.

Figures 3, 4, 5, 6, 7, 8:
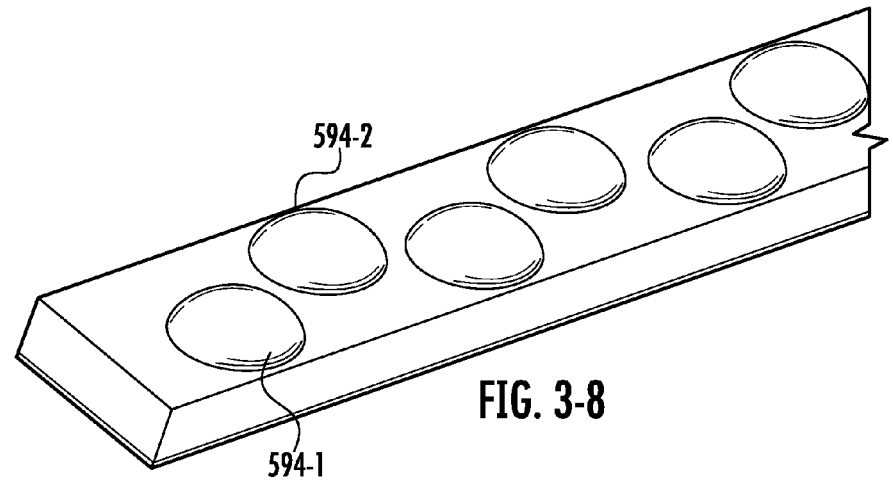

An embodiment of an apparatus using such Frequency Selective Surfaces (FSS) shown in FIG. 8. These FSS, also known as chirped Bragg layers, are provided by a set of fixed layers of low dielectric constant material 1012 alternated with high dielectric constant material 1010. The spacing of the layers is such that the energy is reflected where the spacing is ¼ wavelength. The relatively higher frequencies (lower wavelengths) are reflected at layers P1 (those nearer the top surface of waveguide 100) and the lower frequencies (high wavelengths) at layers P2 (those nearer the bottom surface). The local (or specific) layer spacing as function of distance along P1 to P2 is adjusted to obtain the required propagation constant as a function of frequency to achieve wideband frequency independent beams. Equation (1) can be solved for a given beam direction to obtain the geometry of the chirped Bragg layers.

Figures 3, 4, 5, 6, 7, 8, 9, 10, 11, 12, 13:
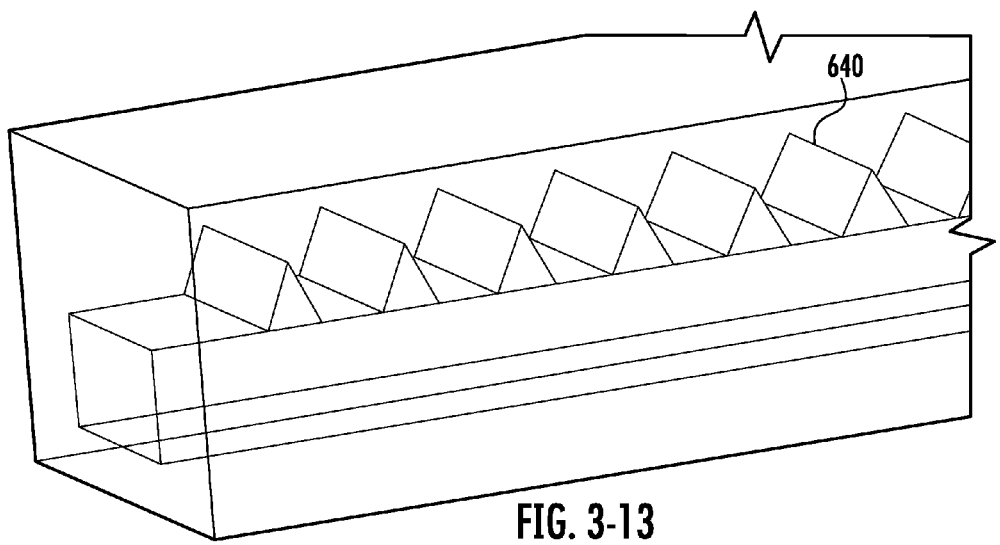

FIG. 9 is a depiction of the waveguide with multiple chirped Bragg layers 1010, 1012 located beneath a primary, non-Bragg waveguide layer 1030. This example (the illustrated Bragg layers are not to scale) was modeled using alternating layers made up of SiO2 and TiO2; however any material(s) with differing dielectric constants could be used in these layers.

Spacing of the Bragg layers 1010, 1012 can be determined as follows. An equation governing the beam angle of a traveling wave fed linear array is:

cos(theta)=beta (waveguide)/beta (air)+lambda/element spacing where beta (waveguide) is the propagation constant of the guide.

To eliminate the frequency dependency of theta, we solve the equation for beta (waveguide). The required frequency dependency of beta can be fashioned by controlling the effective thickness of the waveguide as a function of frequency derived by using the general dispersion curve of the waveguide itself.

The effective thickness as a function of frequency is then provided by a series of chirped Bragg layers as shown in FIG. 9 forming the waveguide. Each layer is composed of two sub layers of a high dielectric and a low dielectric. Each sub layer is preferably ¼ wavelength thick at the frequency at which energy is reflected in that layer. The layers get progressively thicker such that the lower frequencies reflect at the thicker layers. The methodology of determining the geometry of the layered structure is a recursion relation involving creation of the above layers starting at the top layer (L=1), the reflecting layer at the highest frequency f(1). The next layer (L=2) is determined by the relation T(f(L))–T(f(L−1))=k/f(L) where k is the average velocity in the structure, and L is the layer number. The next adjacent layer follows this recursive relationship, and so forth.

Beamwidth Control

To increase the array length while maintaining a beamwidth, quadratic phase weights may be added. Because the solar angular arc width is 0.5 degrees, we preferably maintain a beamwidth around 0.5 degrees across all frequencies. This can be accomplished by implementing a quadratic phase weighting along the primary axis of the 1-D array, and can be achieved with either 1) gradually tapering a dielectric layer itself (as shown in FIG. 10-1) located over the scattering elements 400 or 2) a sub-surface array of elements with quadratic length taper along the array axis (FIG. 10-2). The quadratic phase weighs the physical size of the array beyond 100 λ.

The sub-surface elements within the waveguide can be varied in length, spacing, and or depth within the waveguide to obtain the desired quadratic phase weighting. Regardless, the sub surface elements are located deep enough within the waveguide so as to not radiate outside the waveguide. The tapered layer be defined by $$\phi(x)=e^{i\alpha x^2}$$

where x is the distance along the waveguide and α is a weighting constant.

Scanning and Steering

The high gain fan beams of the 1D sub array "rods" therefore need only be steered in one dimension in order to track the sun as it travels across the sky. This steering can be achieved in two ways: mechanical and electrically. The 1D tracking requirement facilitates either mechanical or electrical tracking methodologies.

Mechanical

In this approach, the traveling wave solar cell is placed on a support that is mechanically positioned utilizing a positioner or some other mechanical means such as MEMs or electro active devices.

Electrical

In this approach, the system electrically scans the main beam by dynamically changing the volume or spacing of gaps in the dielectric waveguide. It is equivalent to changing the "effective dielectric constant," causing more or less delay through the waveguide. The fields associated with the HE11 mode (the mode operating in the rod type waveguide) are counter propagating waves traversing across the gaps as shown in FIG. 11. The effective dielectric constant change is independent of frequency as long as the gap spacing, s, is less than ¼ wavelength.

Electrical scanning can be achieved by controlling the gap size by with piezoelectric, electro active, or any other control element that is fast acting to effect a change in the propagation constant of the waveguide. The wedge configuration of FIG. 4 is readily amenable to incorporation of the gaps in the waveguide.

To achieve wideband propagation constant control, an additional chirped Bragg structure can be provided to adjust the effective rod diameter as a function of frequency. FIG. 12 shows this additional feature, chirped Bragg frequency selective surfaces (FSS), added to the structure of FIG. 11.

As an added degree of freedom, enhancing the Bragg FSS structure with reconfigurable dielectric layers (FIG. 13) provides better beam steering precision and efficiency. By chirping the structure, the wideband properties of the FSS Bragg layers takes effect, allowing frequency independent beams. With this approach, the reconfigurable structure and Bragg FSS are one in the same.

Rectification

As will now be understood, the sub-array excites a traveling wave or "net energy flow" in the body of the dielectric waveguide, traveling from the collector region towards the detector region at an intensity equal to or greater than 100 suns. The HE11 mode, which has no cut off frequency, would be the mode of choice. This mode is set up by properly dimensioning the waveguide and a careful selection of scattering element size distribution and layout.

Figures 3, 4, 5, 6, 7, 8, 9, 10, 11, 12, 13, 14:
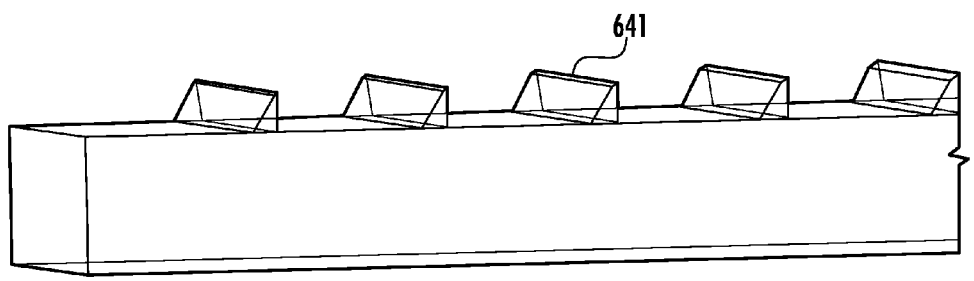

FIG. 14 illustrates an arrangement where multiple 1-D arrays 1500-1, 1500-2, . . . 1500-n are positioned end to end. An extended correction wedge 1510 covers the length of the assembly above the 1-D arrays 1500. An angular configurable gap 1550 may be provided to introduce a small change in wave propagation and can be controlled mechanically or with application of heat. A small charge in this gap angle can result in a large change in beam direction.

Spatially Separated Photovoltaic Cells

Figures 3, 4, 5, 6, 7, 8, 9, 10, 11, 12, 13, 14, 15:
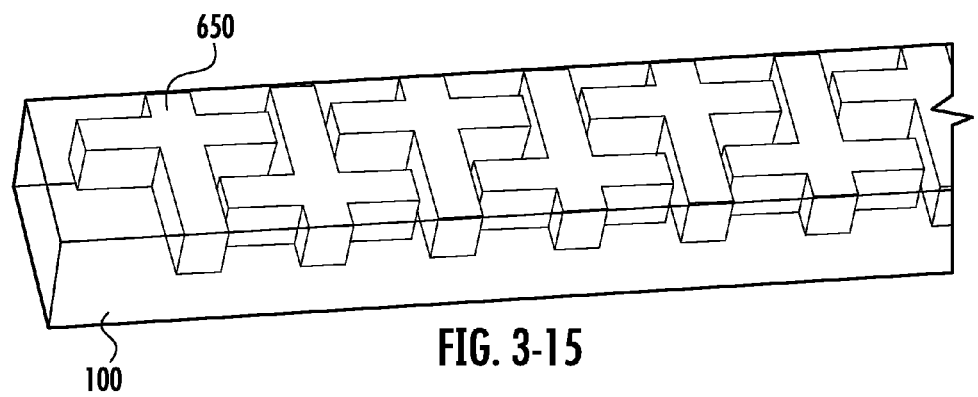
Figures 3, 4, 5, 6, 7, 8, 9, 10, 11, 12, 13, 14, 15, 16:
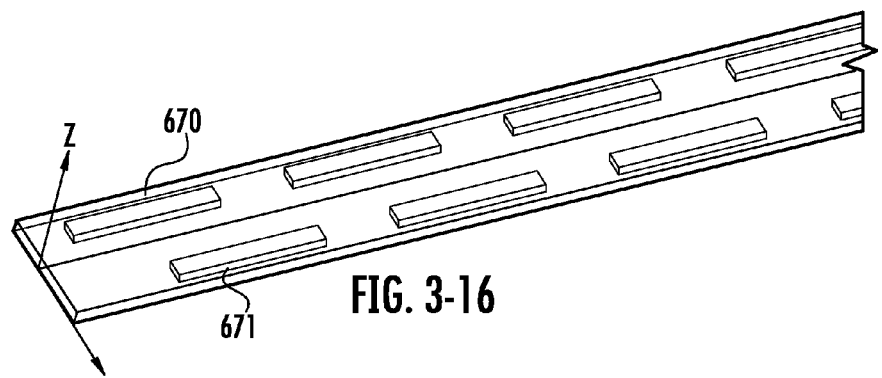
Figures 1, 4:
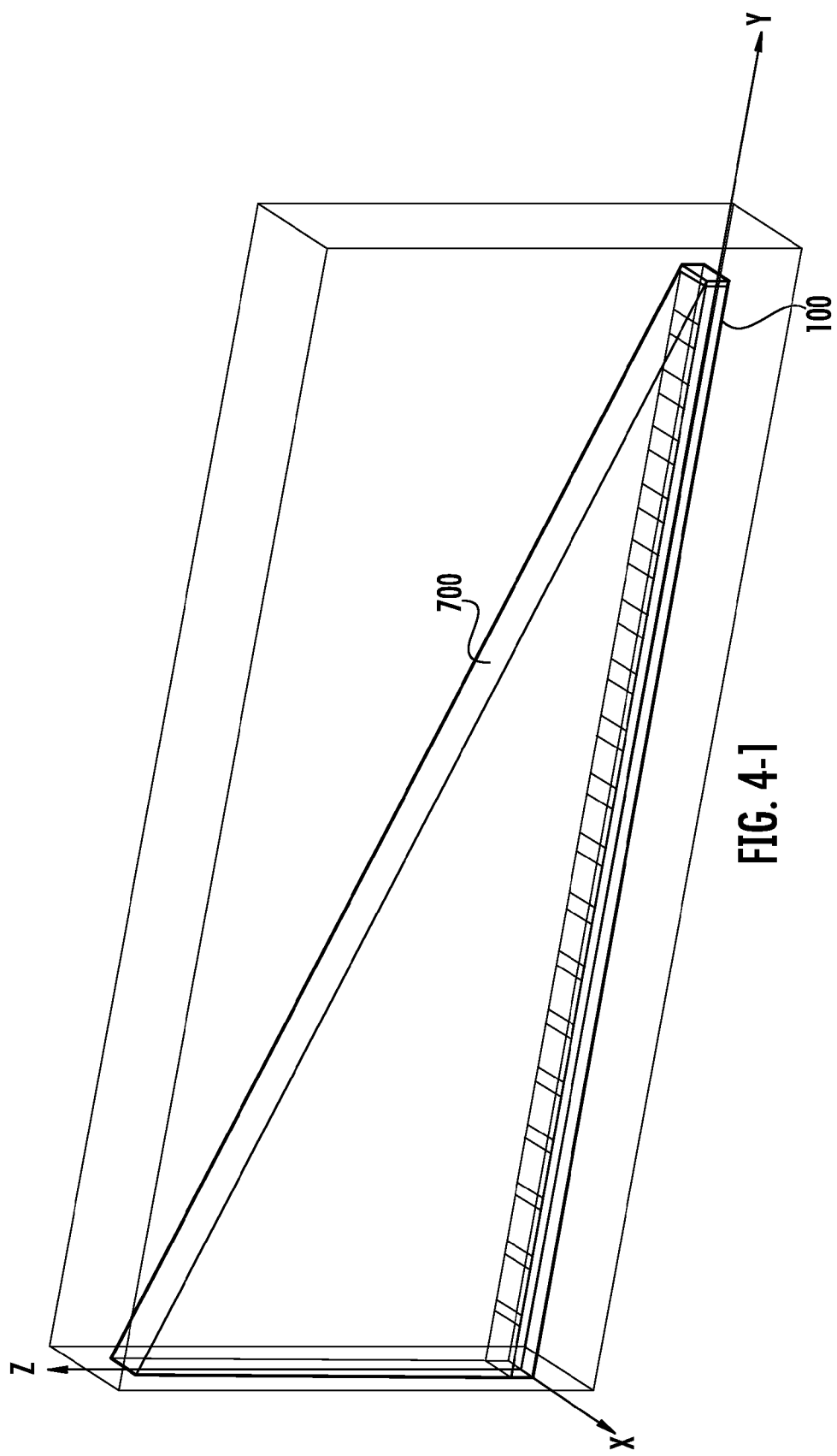
Figures 2, 4:
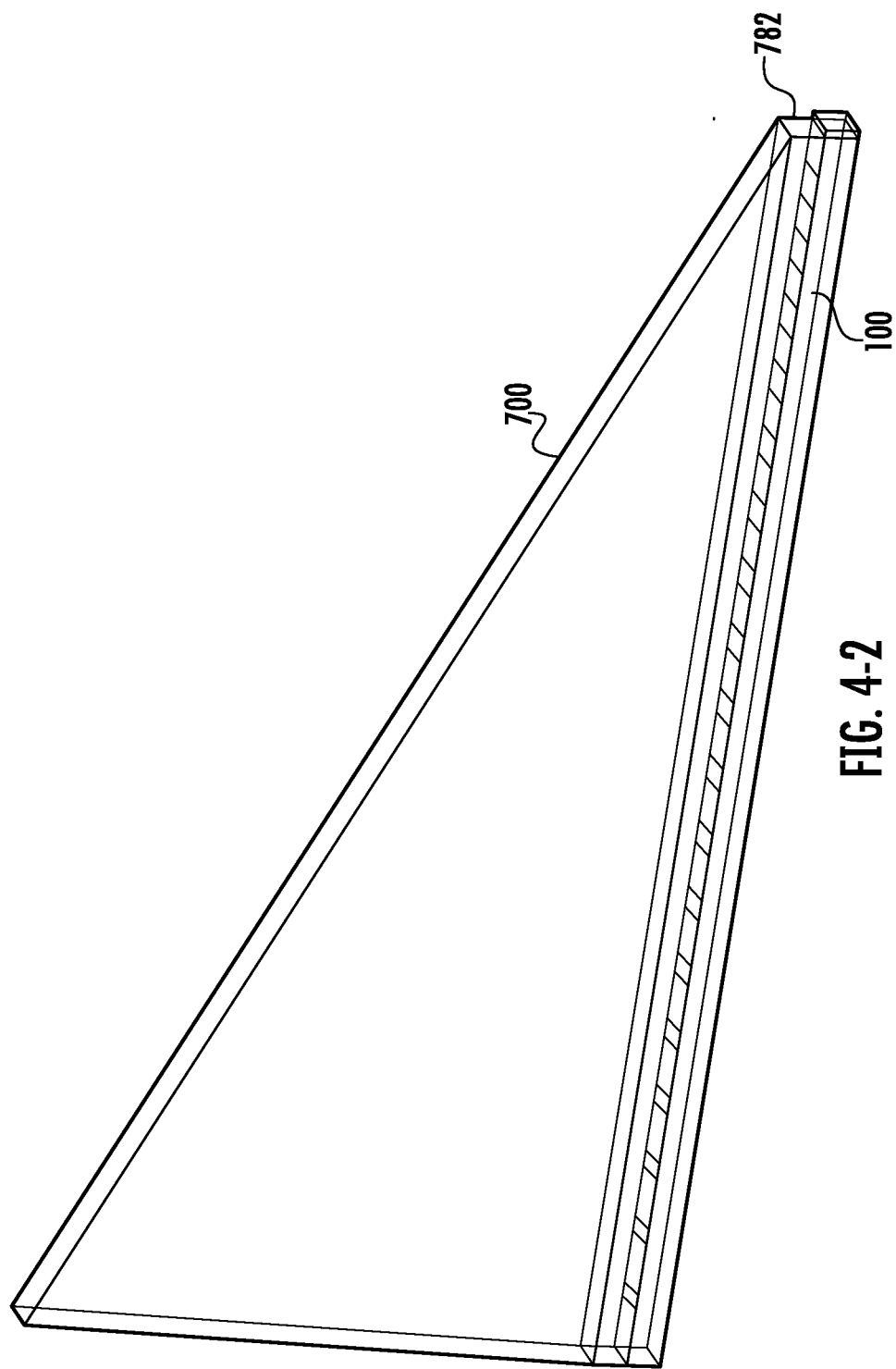
Figures 3, 4:
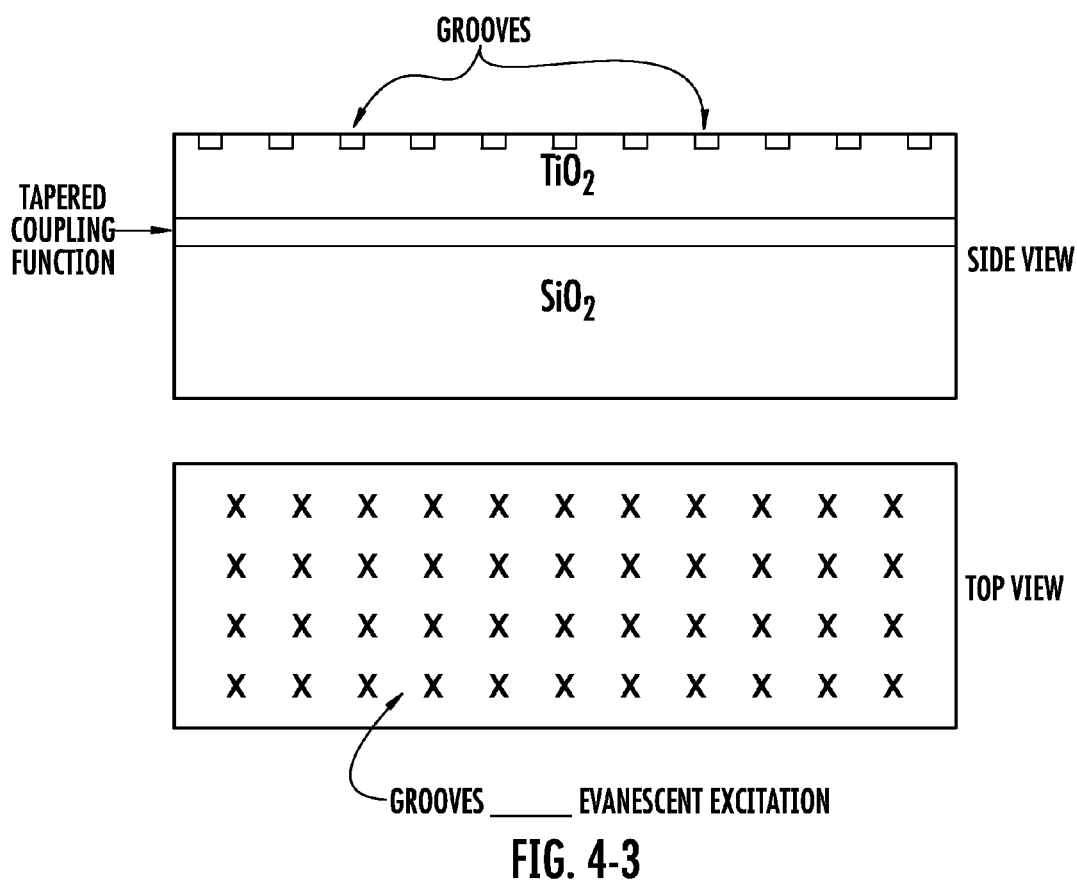
Figure 5:
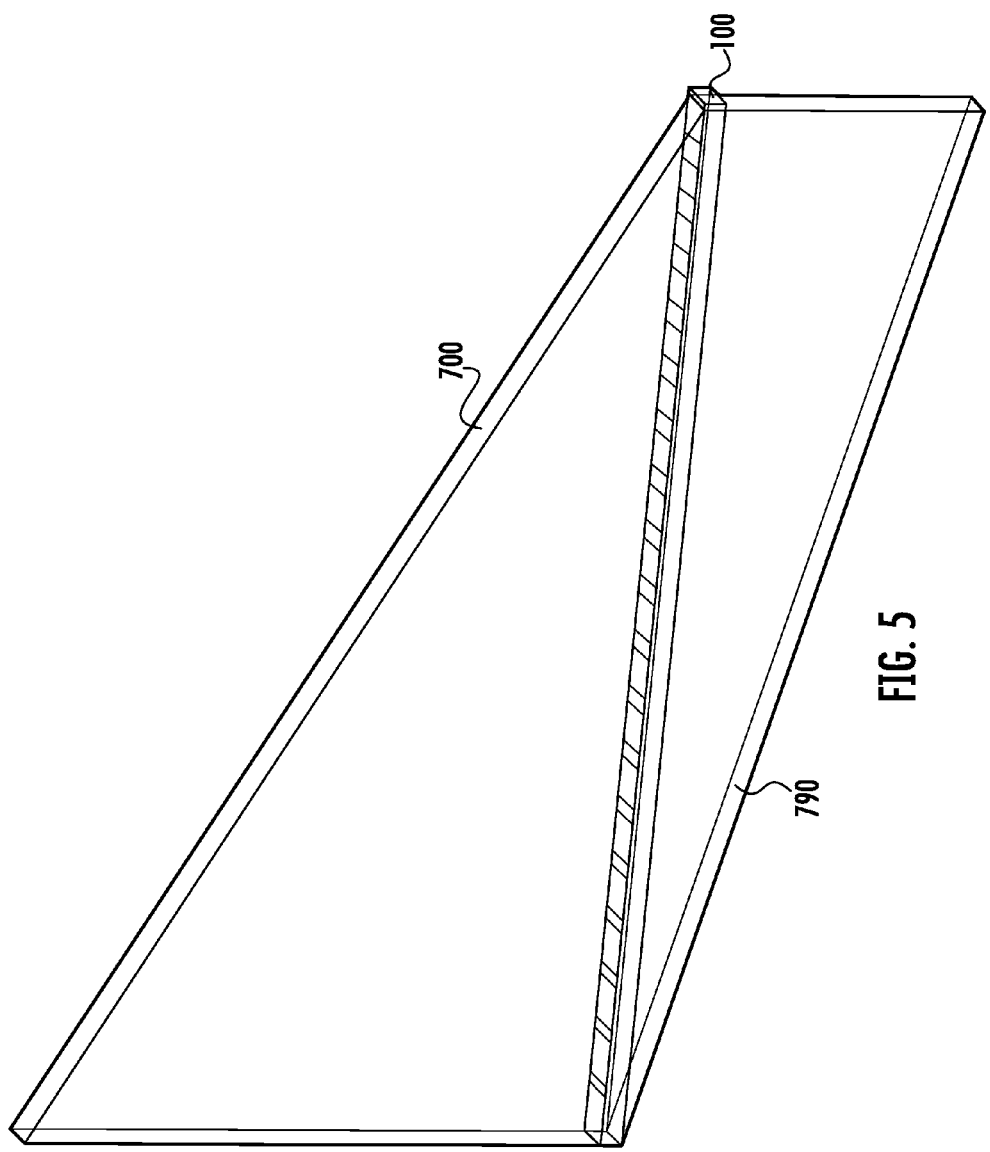
Figure 6:
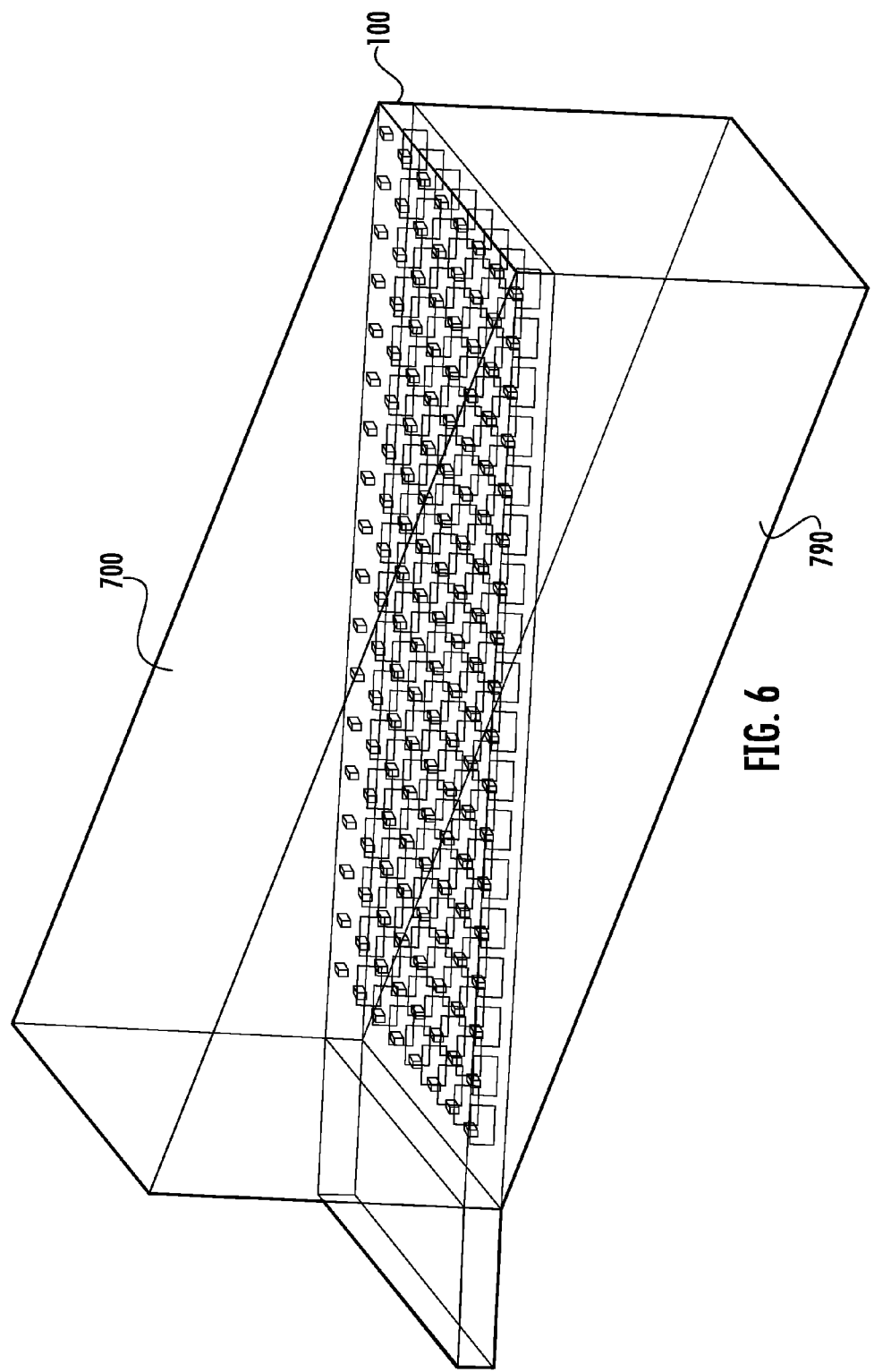
Figure 7:
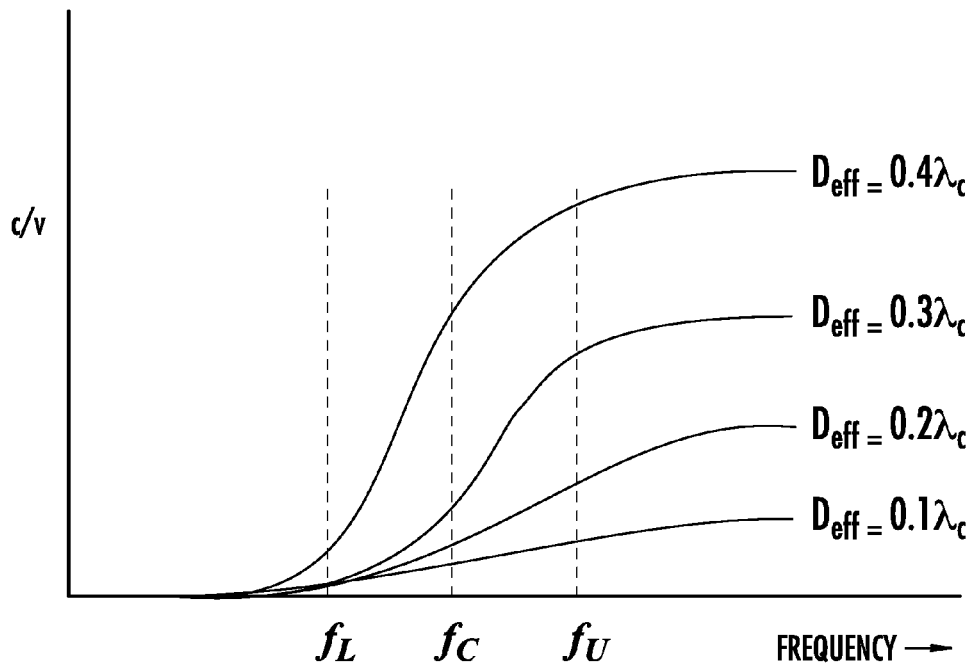
Figure 8:
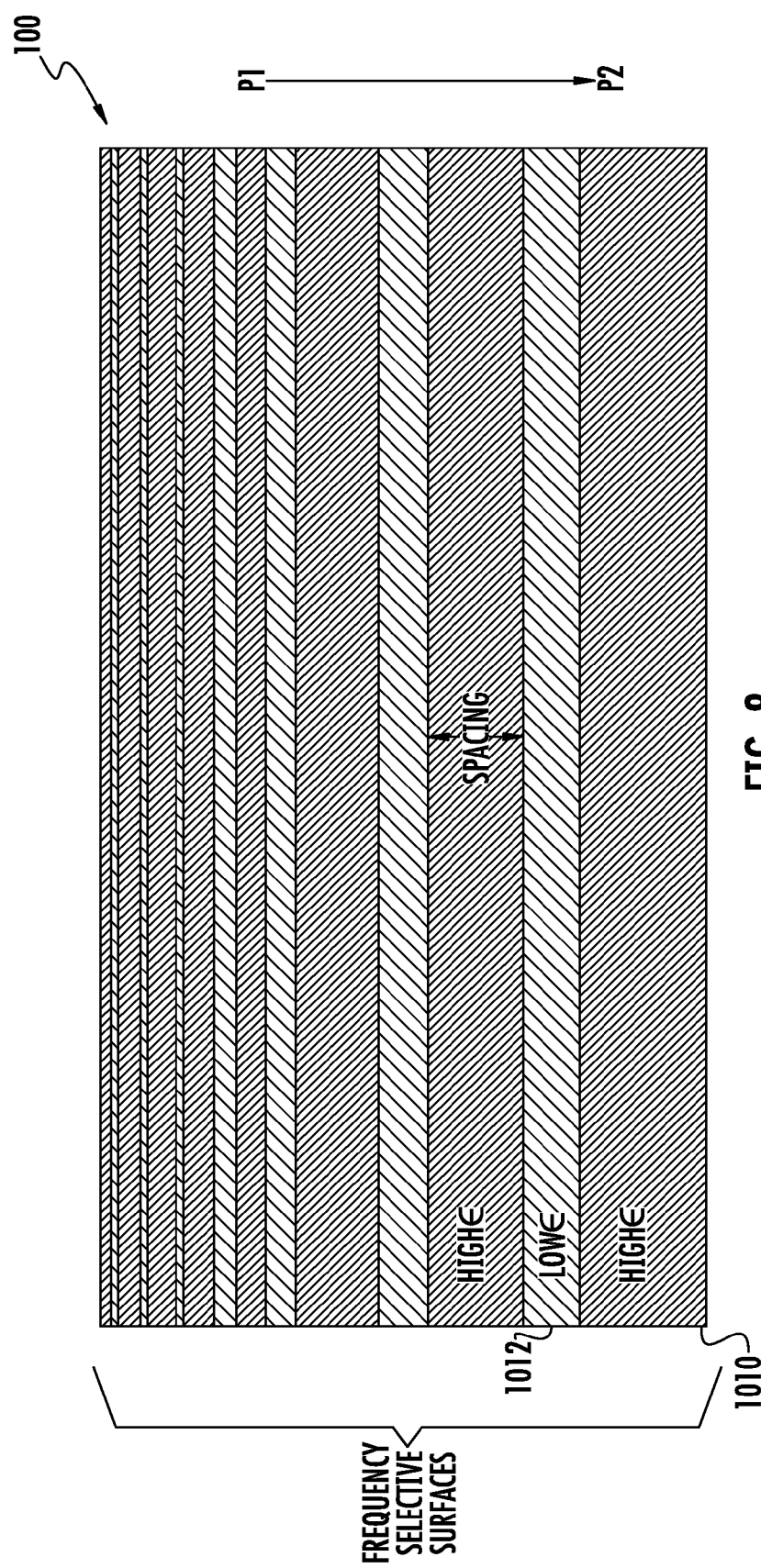
Figure 9:
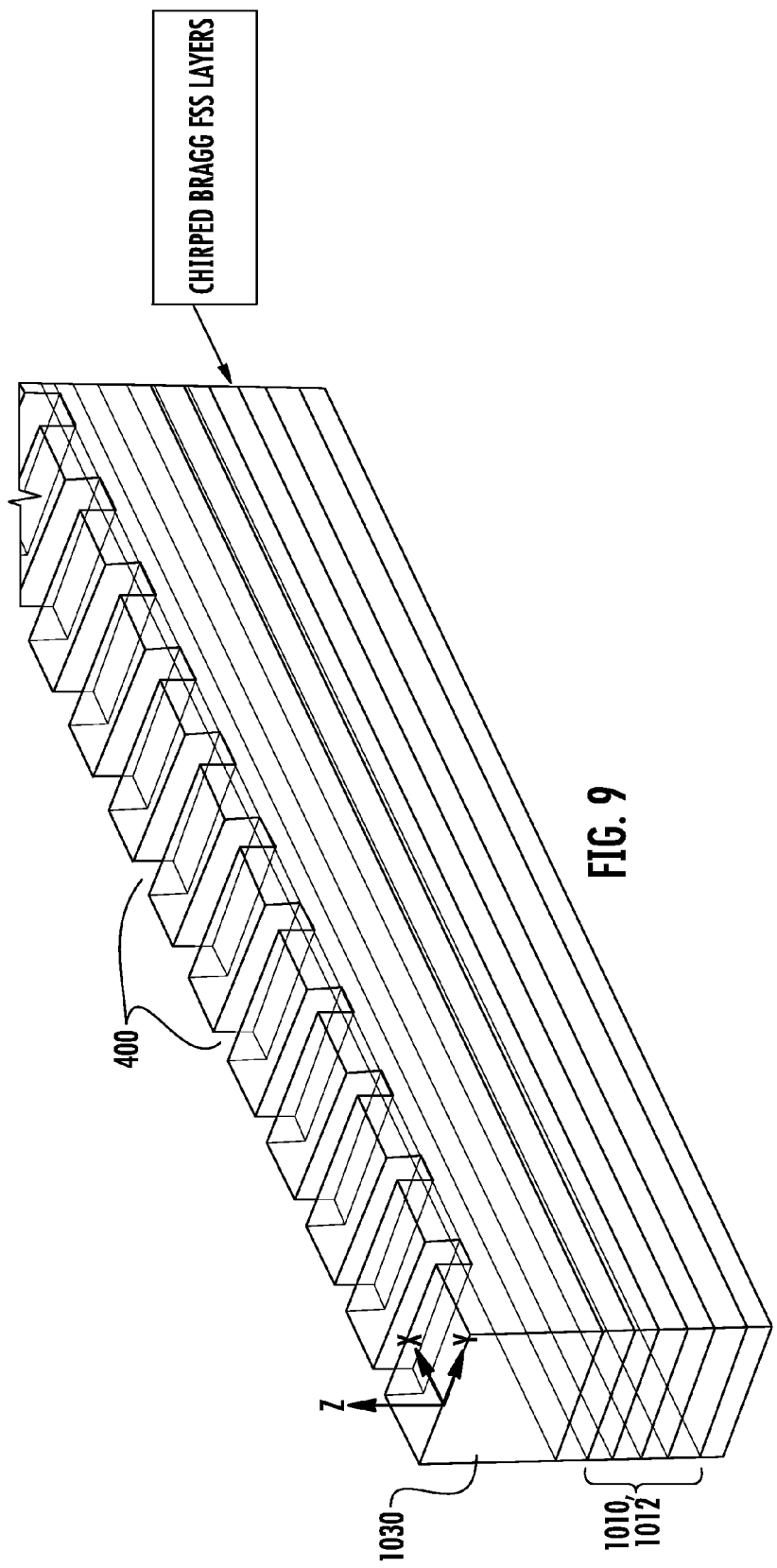
Figures 1, 10:
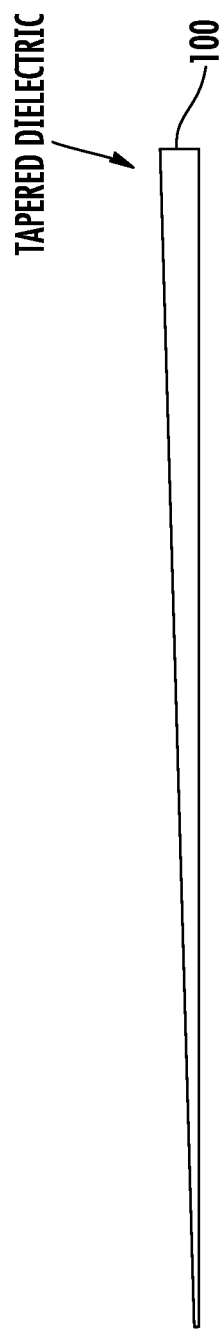
Figures 2, 10:
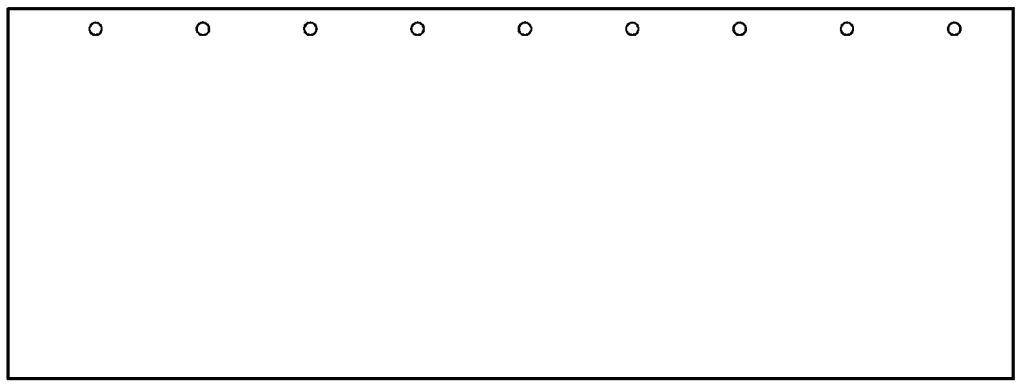
Figure 11:
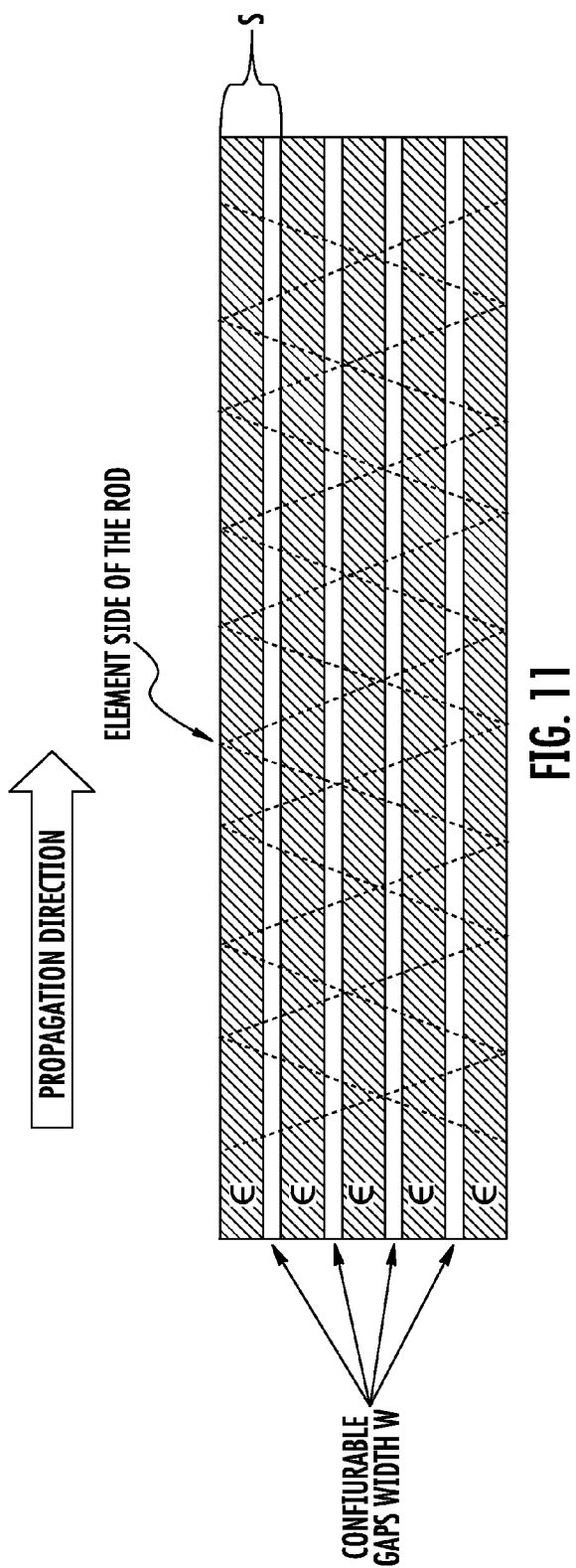
Figure 12:
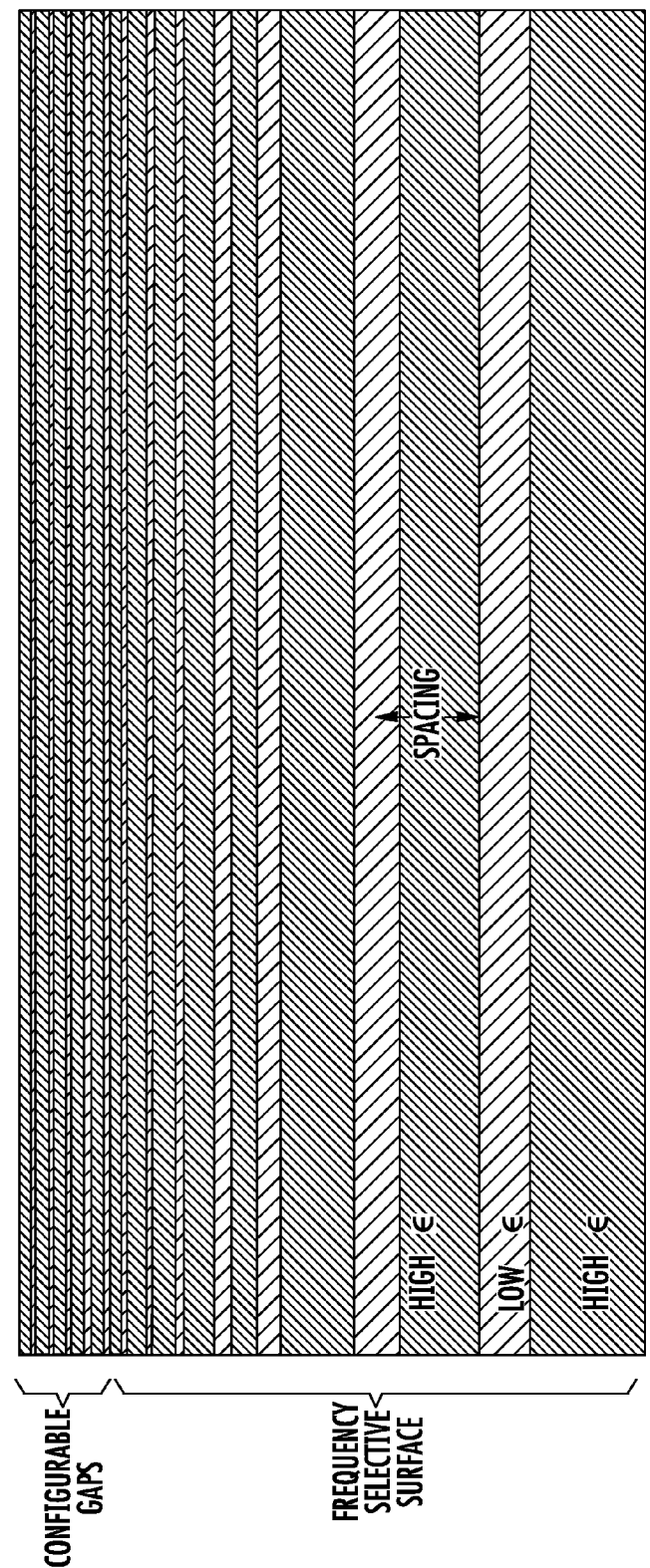
Figure 13:
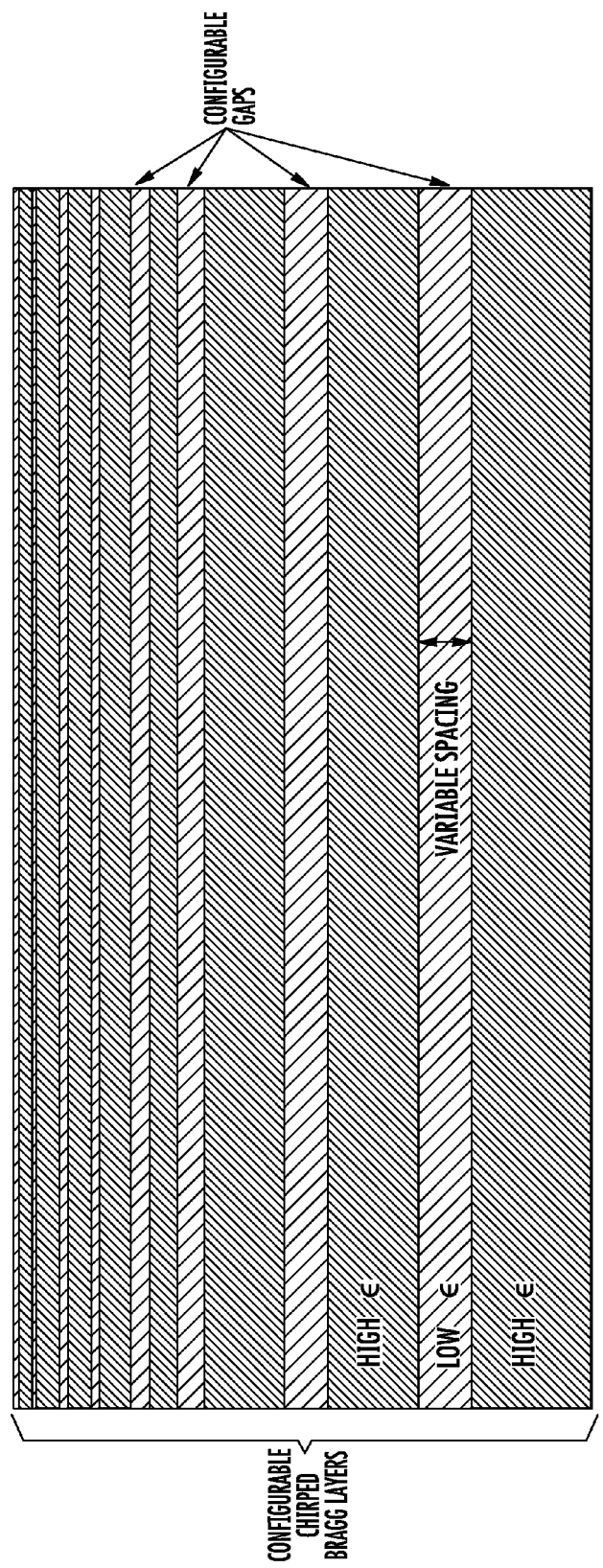
Figure 14:
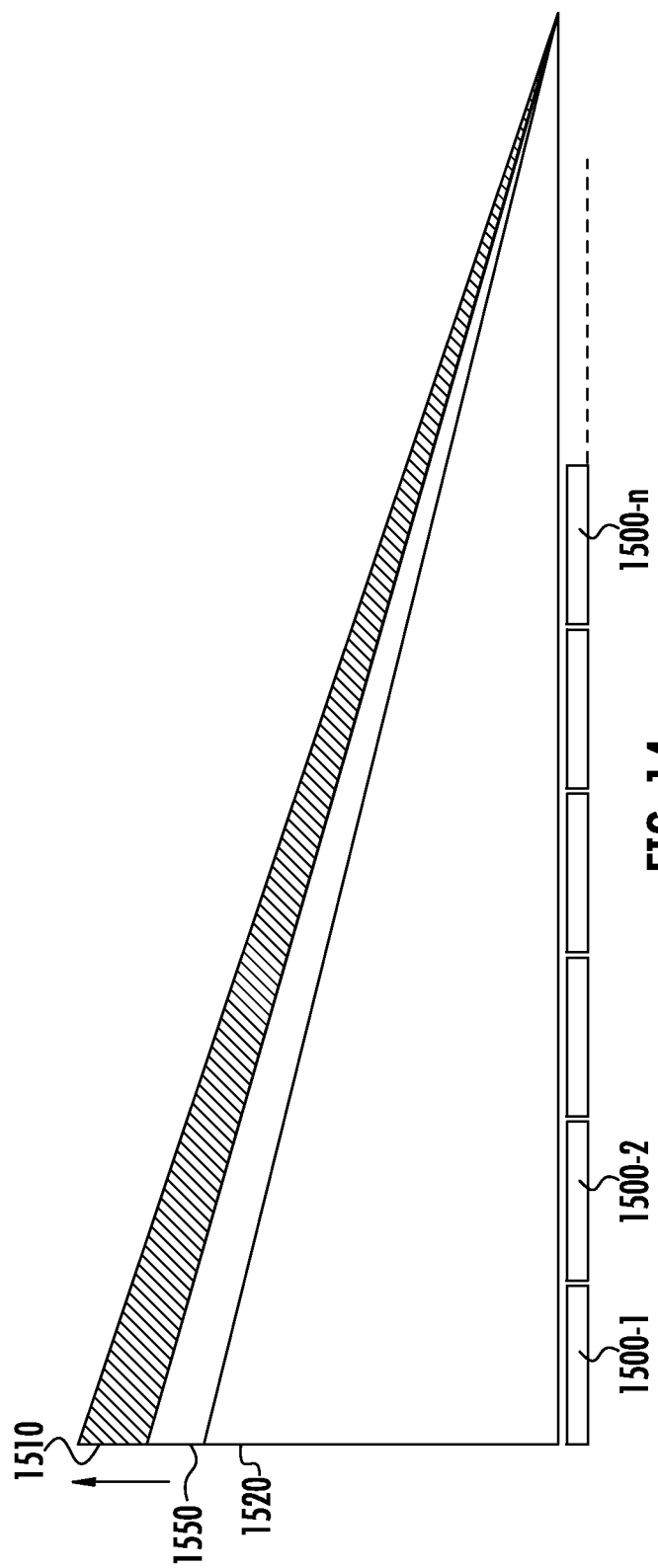
Figure 15:
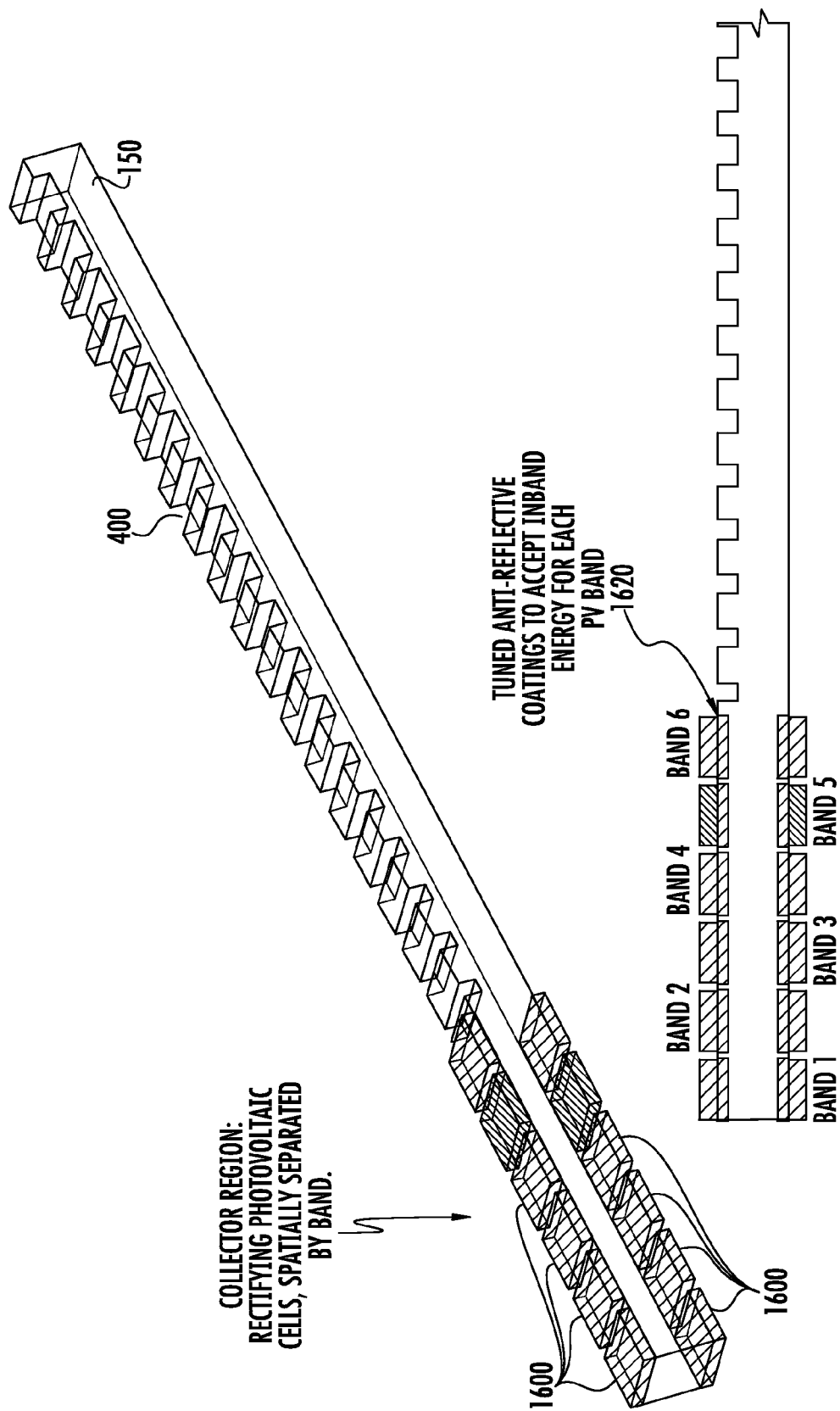
Figure 16:
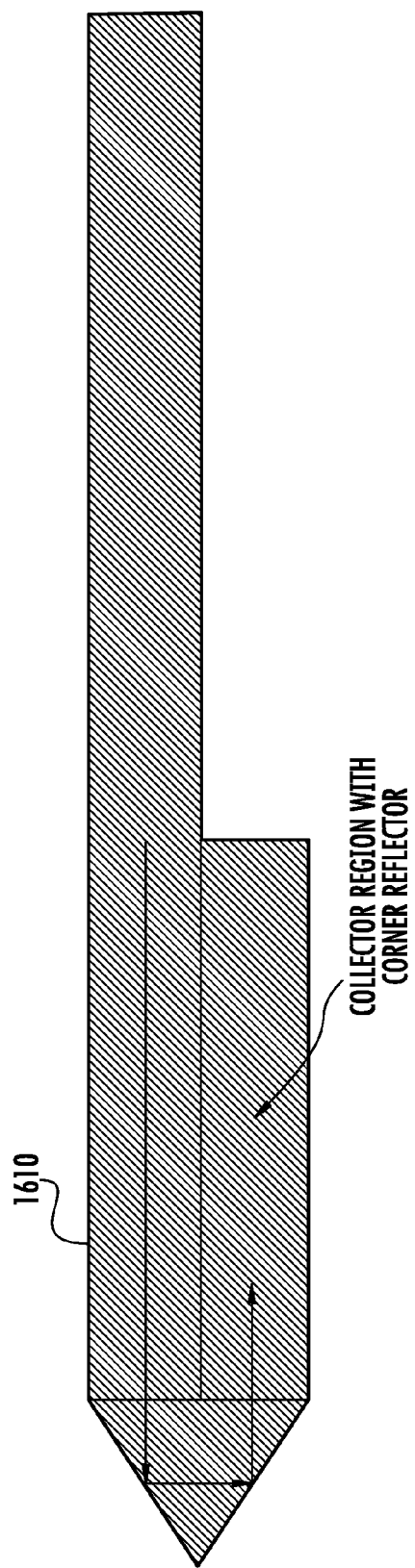

FIG. 15 illustrates one possible configuration of the collectors region in more detail, consisting of a set of spatially separated photovoltaics (PV) 1600. Each of the PV detectors 1600 has a different effective set of responsive wavelengths ("response band"). In this embodiment, 12 detectors (2 for each of six bands from band 1 to band 6) are provided; note that half the detectors can be placed on a top face of the waveguide and the other half on a bottom face of the waveguide. A corner reflector (shown in detail in FIG. 16) ensures wave propagation to the detectors mounted on the bottom face.

A different corresponding tuned anti-reflective (AR) coating 1620 is disposed between each detector 1600 and the waveguide 100 surface(s), to accept only in-band solar energy for each PV detector.

With the HE11 hybrid mode operation of the waveguide, counter-propagating waves are incident on the edges of the waveguide. When these waves reach the collector region, they are incident on the AR coating 1620 and PV cells 1600 at near normal incidence.

The sub array geometry in FIG. 15 shows the collector region where solar energy is converted to DC electricity. The energy incident on the sub array is transmitted along the dielectric waveguide to the collector region.

Figure 17:
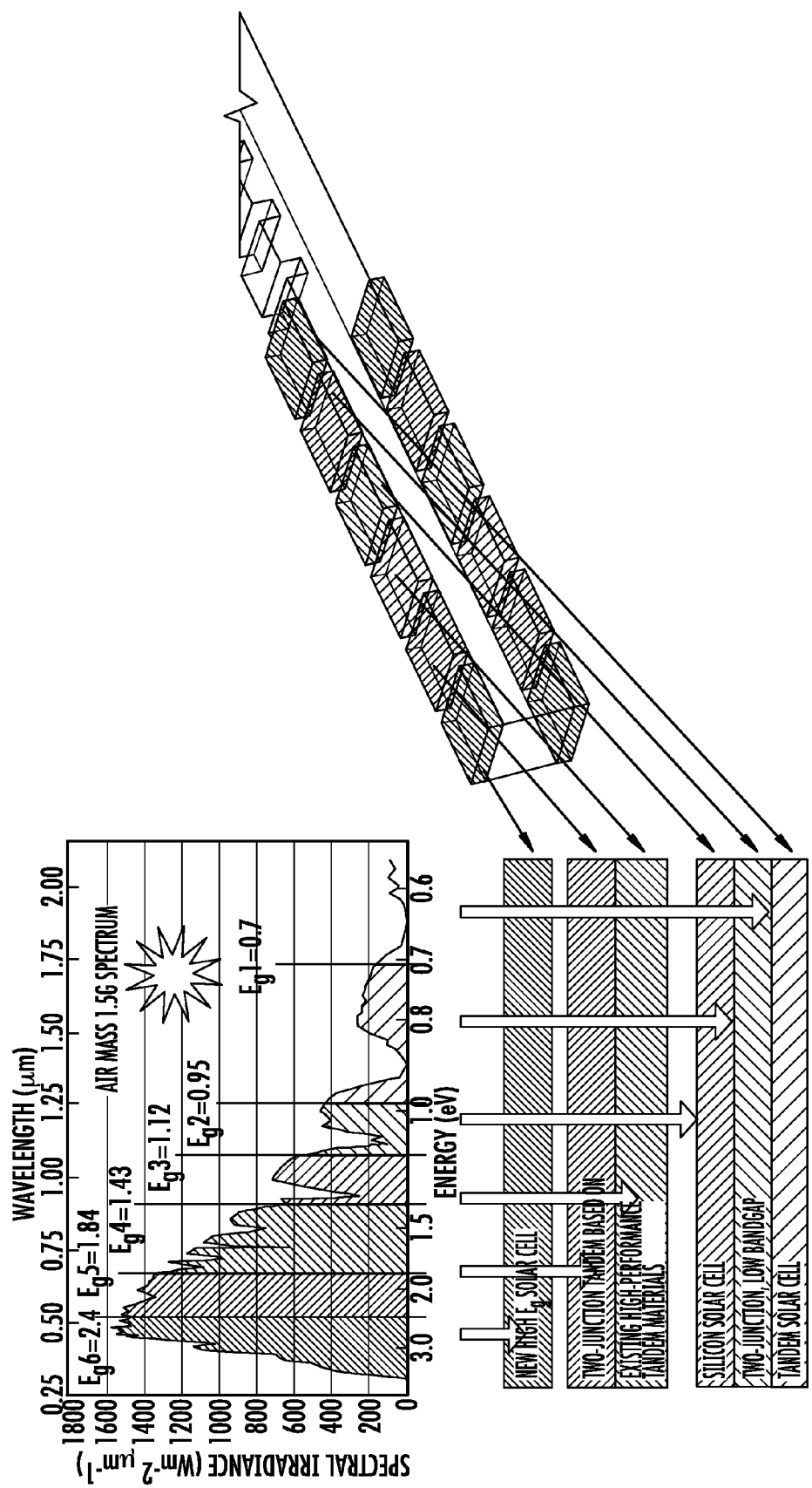
FIG. 17 is a chart illustrating different solar energy spectral bands and appropriate PV materials for each band.

The photovoltaic cells appropriate for each band (corresponding with each wavelength region of the solar band as depicted in FIG. 17) line the waveguide surfaces where collected energy is incident. Since almost all of the solar energy is contained in 6 wavelength bands from 0.4 micrometers to 1.75 micrometers, it is sufficient to use the 6 distinct photovoltaic detectors as were illustrated in FIG. 15. For these distinct bands, there exist photovoltaic cells that are very efficient for their respective bands. While multi-band photovoltaic assemblies exist in previous technology, such assemblies are often not efficient because the cells are stacked on top of one another. By spatially separating the bands, we eliminate this problem. In addition, due to the high gain nature of the travelling wave array, the energy incident on the photovoltaic can be as great as 100 suns in intensity, further increasing the efficiency of this technology.

An anti-reflective (AR) coating 1620 with a pass band corresponding to each band is applied to the waveguide abutting side of the photovoltaic cell 1600. This causes lower frequency energy to travel along the waveguide undisturbed until it reaches the PV collector region appropriate for its wavelength.

Figure 18:
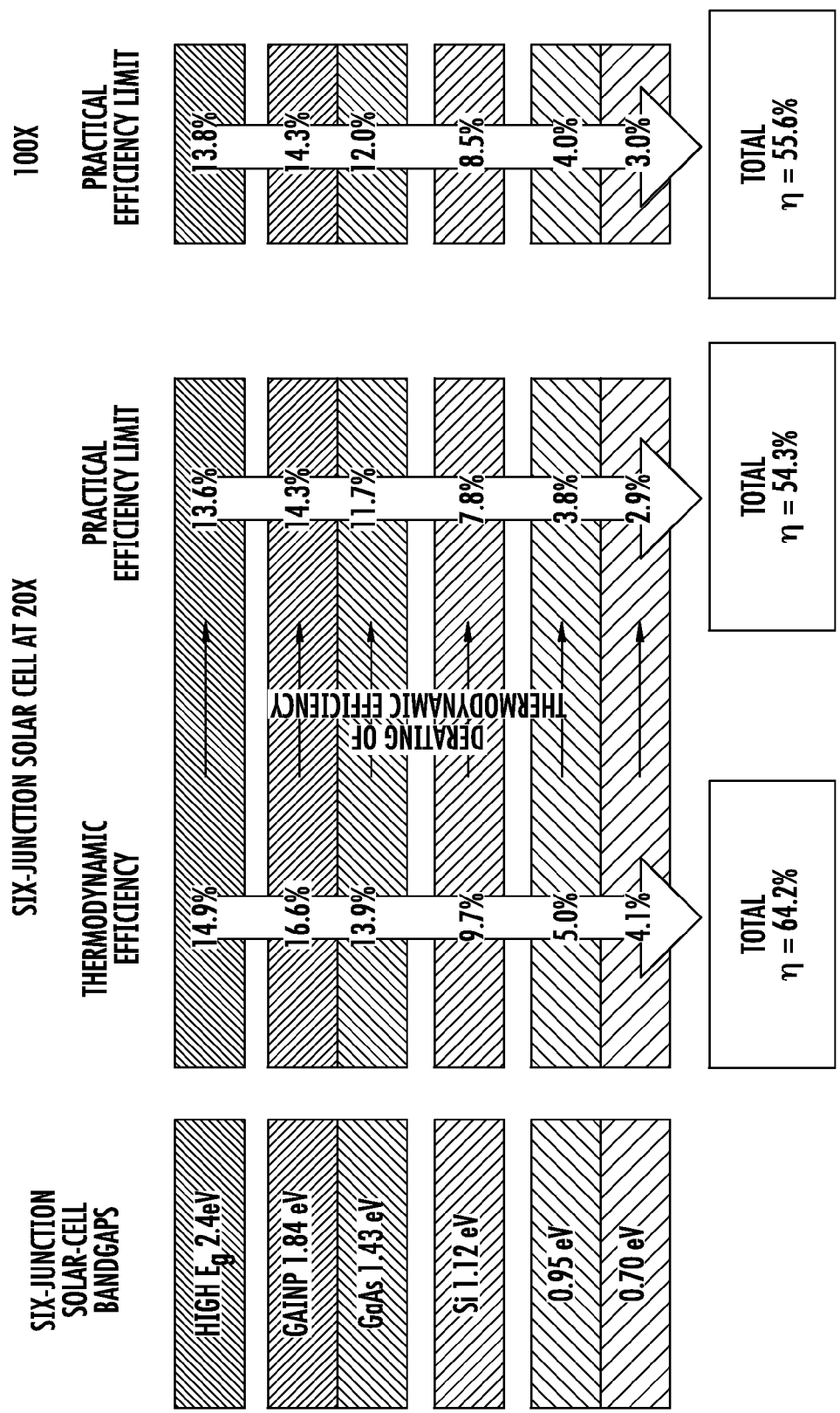
FIG. 18 illustrates the efficiency of different types of solar cells

This spatial separation of differing bands of photovoltaic cells, while not sacrificing any sun-facing surface area causes this solar cell to reach much closer to the theoretical efficiency limit than previous technology, as shown in FIG. 18. The fact that the rectifying collector region surface area is small compared to the energy absorption surface area (antenna to collector region surface ratio >100/1) further supports high solar conversion efficiency. The rectifying region can also be located below the sun-facing area (by means of a bend in the waveguide to transfer energy in another direction), freeing up extra area for increased traveling wave density.

Metal/Insulator/Metal Diodes

Figure 19:
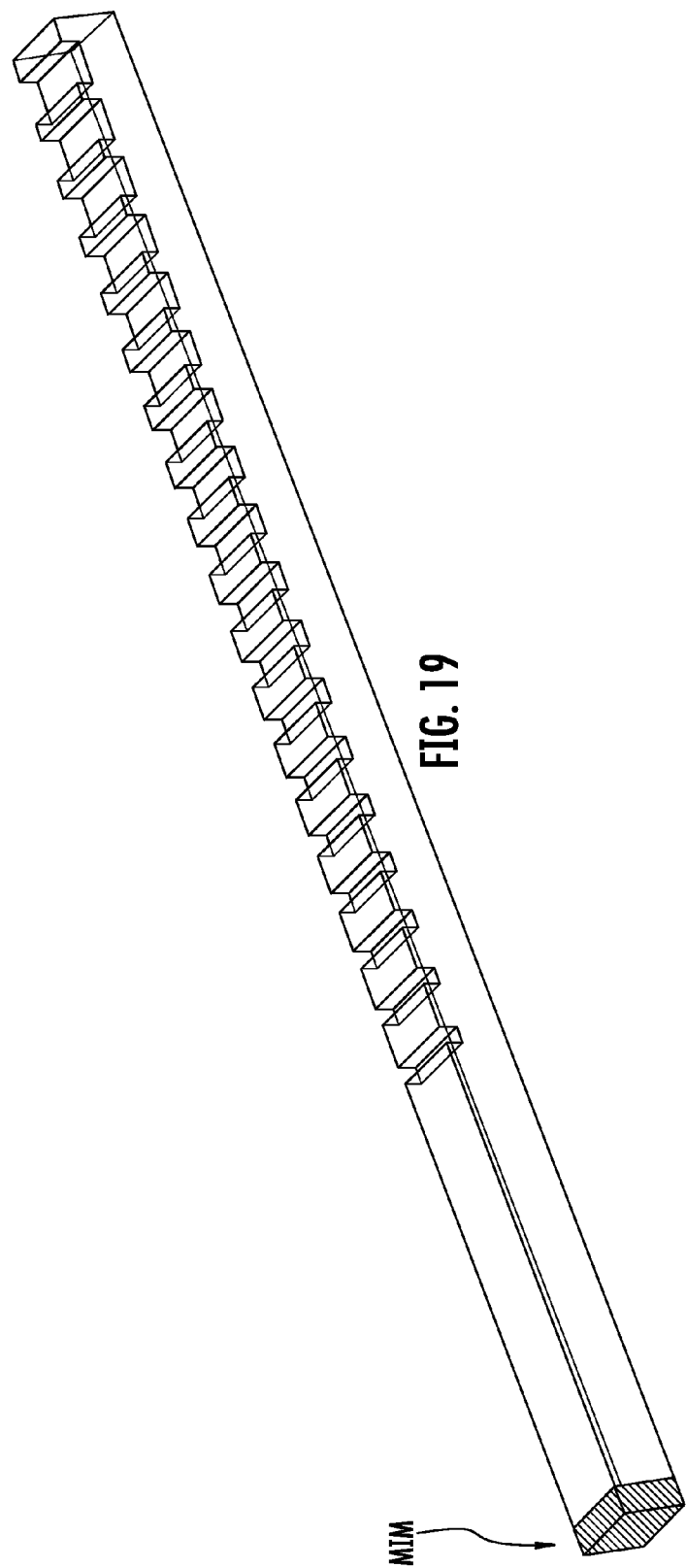
FIG. 19 is a dielectric rod with a MIM diode type detector.
Figure 20:
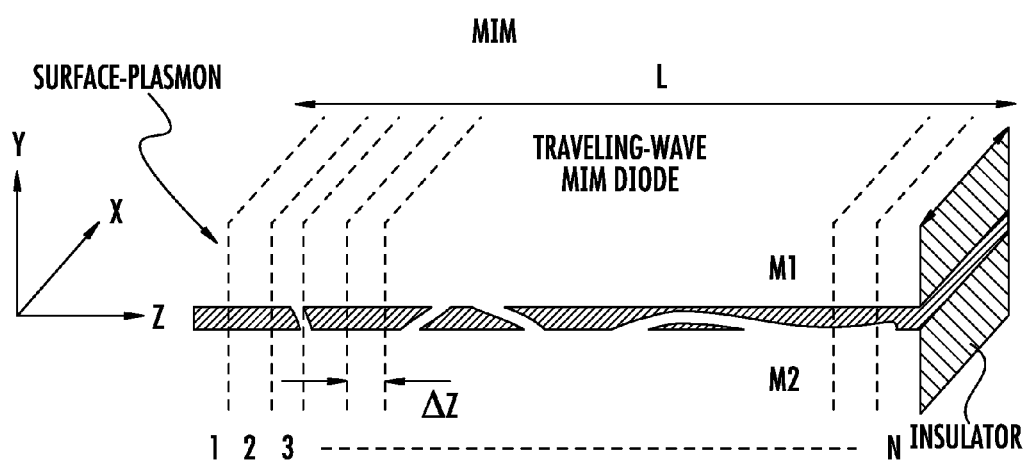
FIG. 20 shows a MIM device in more detail.

The Metal Insulator Metal Diode (MIM) is an emerging technology that promises wideband coupled rectification. Work has been done in bringing this technology to realization—see Sachit Grover, Olga Dmitryeva, M. Estes, Garret Moddel: "Traveling-Wave Metal/Insulator/Metal Diodes for Improved Infrared Bandwidth and Efficiency of Antenna-Coupled Rectifiers", *IEEE Transactions Nanotechnology.* 9(6), (November 2010). One possible geometry of the preferred MIM device is depicted in FIG. 20. These MIMs can be placed at the detection end of the traveling wave antenna waveguide and absorb energy incident on their surface (see FIG. 19). Because MIMs are efficient over a wide band (most of the solar spectrum), there is no need to spatially separate multiple such devices, simplifying the build process.

Other Modes of Operation

Wideband solar with fixed beam (no scanning layers) and mechanical means of elevation beam scanning with micro mechanical actuation.

Wideband phased array with beam scanning

Narrowband beam scanning with no frequency selective layers needed.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

The invention claimed is:

1. A solar energy apparatus comprising:
    a carrier;
    a waveguide, disposed on the carrier, the waveguide having a top surface, a bottom surface, a collection end, and a detection end;
    one or more scattering features disposed on the top surface of or within the waveguide, the scattering features extending from the collection end to the detection end, and operating with the waveguide in a leaky propagation mode to receive energy within a solar wavelength region;
    wherein the scattering features further comprise one or more metallic structures located on or within the waveguide;
    wherein the width of a selected scattering feature decreases monotonically with respective position of the selected scattering feature from the collection end to the detection end; and
    a solar detector, disposed adjacent the detection end.

2. A solar energy apparatus comprising:
a carrier;
a waveguide, disposed on the carrier, the waveguide having a top surface, a bottom surface, a collection end, and a detection end;
one or more scattering features disposed on the top surface of or within the waveguide, the scattering features extending from the collection end to the detection end, and operating with the waveguide in a leaky propagation mode to receive energy within a solar wavelength region;
wherein the scattering features further comprise one or more metallic structures located on or within the waveguide;
wherein the scattering features are spaced apart from one another, with the spacing increasing monotonically with respective position along the waveguide from the collection end to the detection end, and the spacing between any two adjacent scattering features is not greater than ½ a wavelength of a lowest detection wavelength;
a solar detector, disposed adjacent the detection end.

3. The apparatus of claim 1 or claim 2 wherein the solar detector is a MIM diode.

4. The apparatus of claim 1 or claim 2 wherein the solar detector is a photovoltaic.

5. The apparatus of claim 1 or claim 2 wherein the scattering features are metallic structures disposed on the waveguide, and comprise two or more rods disposed in parallel with one another, and a detector is coupled to at least one end of each rod.

6. The apparatus of claim 1 or claim 2 wherein the scattering features are metallic structures formed in a top surface of the waveguide.

7. The apparatus of claim 6 wherein the scattering features are rectangular or triangular in cross-sectional shape.

8. The apparatus of claim 1 or claim 2 wherein the scattering features are rectangular or triangular structures extending above the top surface.

9. The apparatus of claim 1 or claim 2 wherein the metallic structures are disposed entirely within a sub-surface of the waveguide.

10. The apparatus of claim 1 or claim 2 wherein the waveguide is a dielectric of a material selected from the group consisting of $Si_3N_4$, $SiO_2$, $MgF_2$, and $TiO_2$.

11. The apparatus of claim 1 or claim 2 wherein a cladding layer with a lower dielectric constant than the waveguide is disposed adjacent the waveguide.

12. The apparatus of claim 1 or claim 2 wherein the scattering features loosely couple to waves propagating within the waveguide, causing the waveguide to leak power along a portion of its length.

13. The apparatus of claim 1 or claim 2 wherein the waveguide is a two dimensional slab and the metallic structures are arranged in a two dimensional array.

14. The apparatus of claim 1 or claim 2 wherein a correcting wedge shaped layer is disposed above the waveguide, the wedge tapering from a thin section at the collection end to a thick section near the detection end.

15. The apparatus of claim 14 wherein the correcting wedge introduces delay to incident energy entering the apparatus, with the delay increasing from the collection end to the detection end.

16. The apparatus of claim 14 wherein a second wedge disposed beneath the waveguide corrects dispersion introduced by the correcting wedge.

17. The apparatus of claim 14 wherein a low dielectric constant width gap is disposed between the correcting wedge and the waveguide.

18. The apparatus of claim 13 when a correcting slab layer is disposed beneath the waveguide.

19. The apparatus of claim 1 or claim 2 wherein the metallic structures are dispersed along columns, and metallic structures in a given column are orthogonal to the metallic structures in an adjacent column.

* * * * *

UNITED STATES PATENT AND TRADEMARK OFFICE
CERTIFICATE OF CORRECTION

PATENT NO. : 8,710,360 B2  
APPLICATION NO. : 13/357448  
DATED : April 29, 2014  
INVENTOR(S) : John T. Apostolos It is certified that error appears in the above-identified patent and that said Letters Patent is hereby corrected as shown below:

In the Claims:

Claim 2, col. 13, line 20 should read:  
~~a wavelength of a lowest detection wavelength;~~  
a wavelength of a lowest detection wavelength; and Claim 19, col. 14, line 34 should read:  
~~The apparatus of claim 1 or claim 2wherein the metallic~~  
The apparatus of claim 1 or claim 2 wherein the metallic Signed and Sealed this  
Twenty-ninth Day of July, 2014

Michelle K. Lee  
*Deputy Director of the United States Patent and Trademark Office*